US009064328B2

(12) United States Patent
Carpio et al.

(10) Patent No.: US 9,064,328 B2
(45) Date of Patent: Jun. 23, 2015

(54) DUAL IMAGE METHOD AND SYSTEM FOR GENERATING A MULTI-DIMENSIONAL IMAGE OF A SAMPLE

(71) Applicant: Ingrain, Inc., Houston, TX (US)

(72) Inventors: Gustavo Carpio, Houston, TX (US); Timothy Cavanaugh, Houston, TX (US); Boaz Nur, Houston, TX (US); Michael Suhrer, Houston, TX (US)

(73) Assignee: Ingrain, Inc., Houston, TX (US)

( * ) Notice: Subject to any disclaimer, the term of this patent is extended or adjusted under 35 U.S.C. 154(b) by 285 days.

(21) Appl. No.: 13/649,409

(22) Filed: Oct. 11, 2012

(65) Prior Publication Data

US 2013/0094716 A1    Apr. 18, 2013

Related U.S. Application Data

(60) Provisional application No. 61/547,090, filed on Oct. 14, 2011.

(51) Int. Cl.
| | | |
|---|---|---|
| *G06K 9/00* | (2006.01) | |
| *G06T 5/50* | (2006.01) | |
| *G06T 7/00* | (2006.01) | |
| *H01J 37/28* | (2006.01) | |
| *H01J 37/22* | (2006.01) | |

(52) U.S. Cl.
CPC .............. *G06T 5/50* (2013.01); *G06T 7/0038* (2013.01); *H01J 37/28* (2013.01); *H01J 37/222* (2013.01); *H01J 2237/226* (2013.01); *H01J 2237/2809* (2013.01); *G06T 2207/10061* (2013.01); *G06T 2207/20221* (2013.01)

(58) Field of Classification Search
None
See application file for complete search history.

(56) References Cited

U.S. PATENT DOCUMENTS

| | | | | |
|---|---|---|---|---|
| 7,088,852 | B1 * | 8/2006 | Bruce et al. | 382/145 |
| 7,750,293 | B2 * | 7/2010 | Principe | 250/307 |
| 7,789,164 | B2 | 9/2010 | Looney et al. | |
| 8,178,838 | B2 * | 5/2012 | Principe | 250/306 |
| 2006/0237652 | A1 * | 10/2006 | Kimchy et al. | 250/363.02 |
| 2009/0279753 | A1 * | 11/2009 | Sakaida | 382/128 |
| 2009/0297006 | A1 * | 12/2009 | Suri et al. | 382/131 |
| 2010/0102239 | A1 * | 4/2010 | Hahn et al. | 250/363.05 |
| 2010/0239144 | A1 * | 9/2010 | Fichtinger et al. | 382/131 |
| 2011/0123078 | A9 * | 5/2011 | Weiss et al. | 382/131 |

OTHER PUBLICATIONS

Keller et al ("3D Geometry and topology of pore pathways in Opalinus clay: Implications for mass transport", 2011).*
International Search Report and Written Opinion issued in corresponding International Patent Application No. PCT/US2012/059689, dated Dec. 14, 2012 (14 pages).
Keller et al., "3D geometry and topology of pore pathways in Opalinus clay: Implications for mass transport," Applied Clay Science, vol. 52, 2011, pp. 85-95.
Wirth, Richard, "Focused Ion Beam (FIB) combined with SEM and TEM: Advanced analytical tools for studies of chemical composition, microstructure and crystal structure in geomaterials on a nanometre scale," Chemical Geology, vol. 261, 2009, pp. 217-229.
Office Action issued by the Canadian Patent Office in corresponding Canadian Patent Application No. 2,850,799 dated Apr. 23, 2015 (4 pages).

* cited by examiner

*Primary Examiner* — Avinash Yentrapati
(74) *Attorney, Agent, or Firm* — Kilyk & Bowersox, P.L.L.C.

(57) ABSTRACT

The present invention relates in part to a method for generating a multi-dimensional image of a sample which combines different image capturing modalities with data analysis capability for identifying and integrating the higher accuracy image features captured by each respective modality to yield reconciled image data of higher accuracy and consistency. A system which can be used to perform the method also is included.

24 Claims, 11 Drawing Sheets

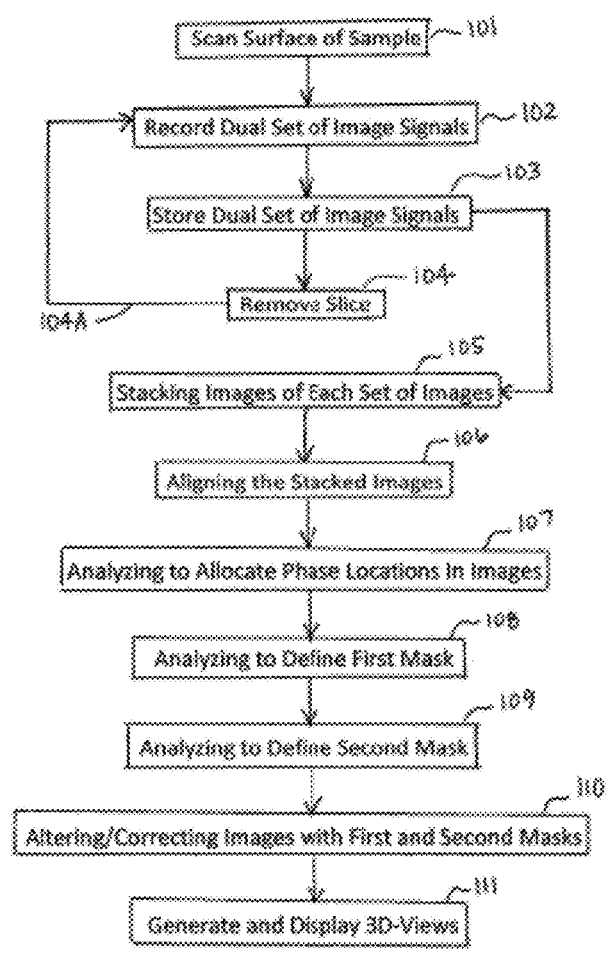

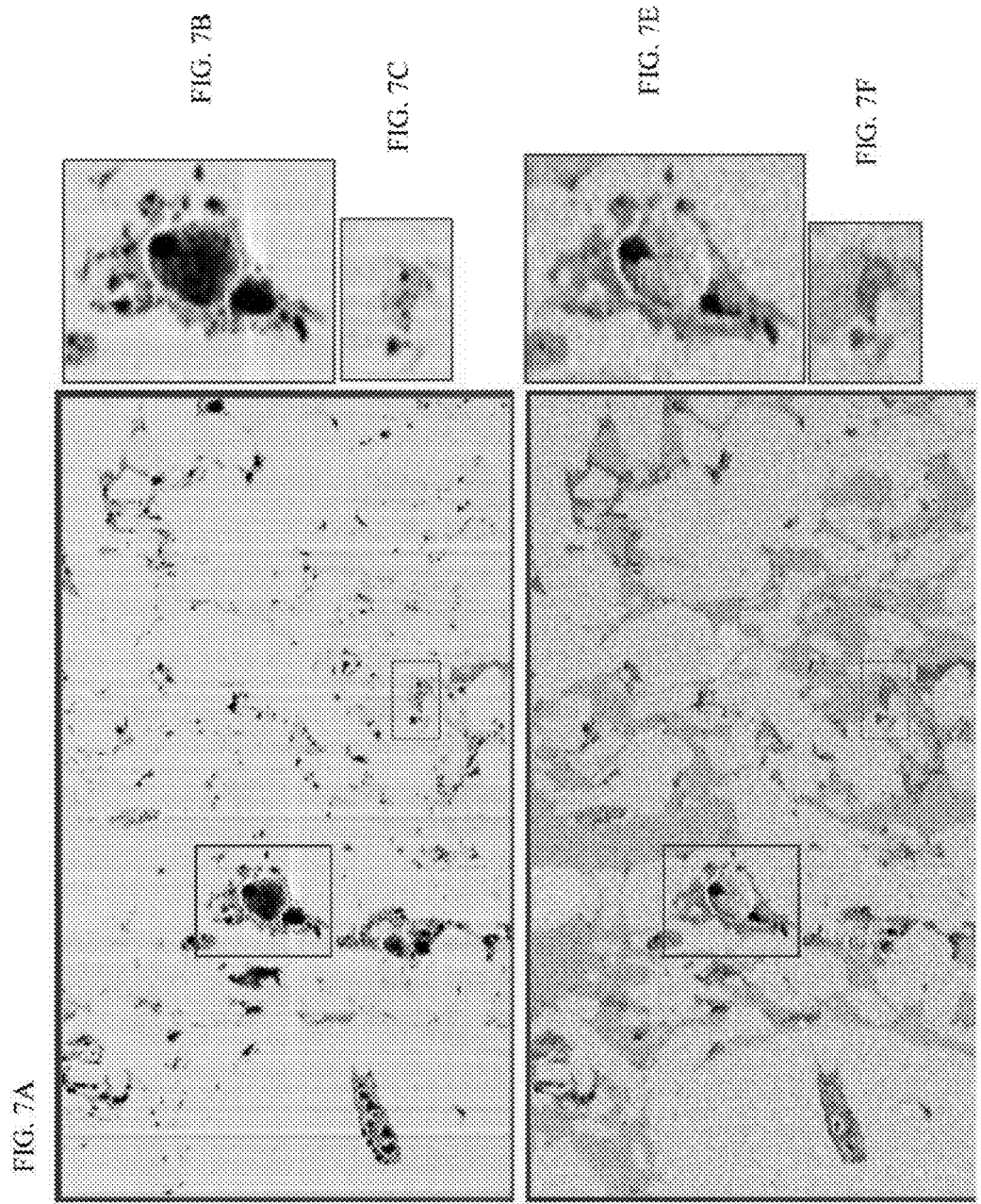

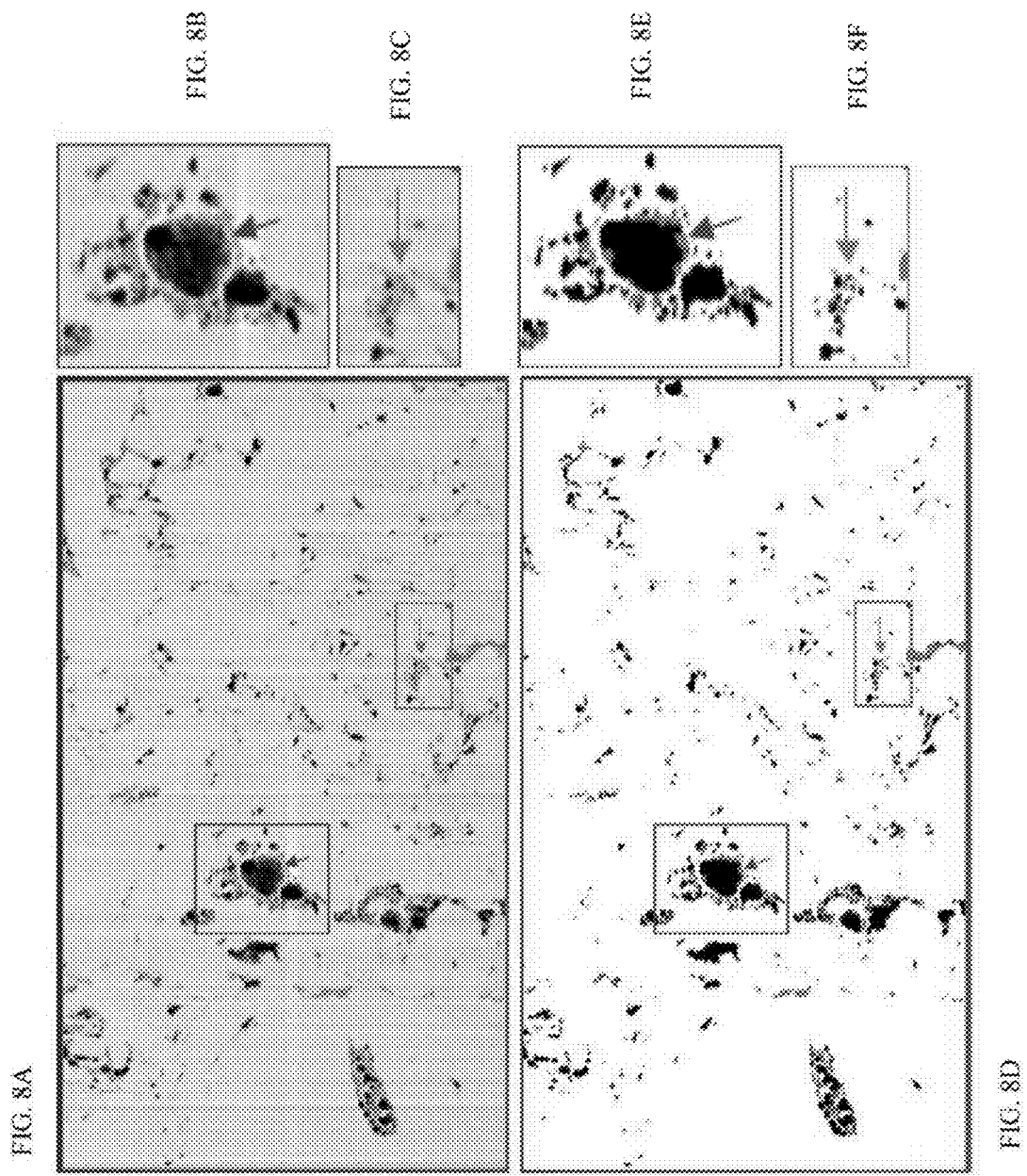

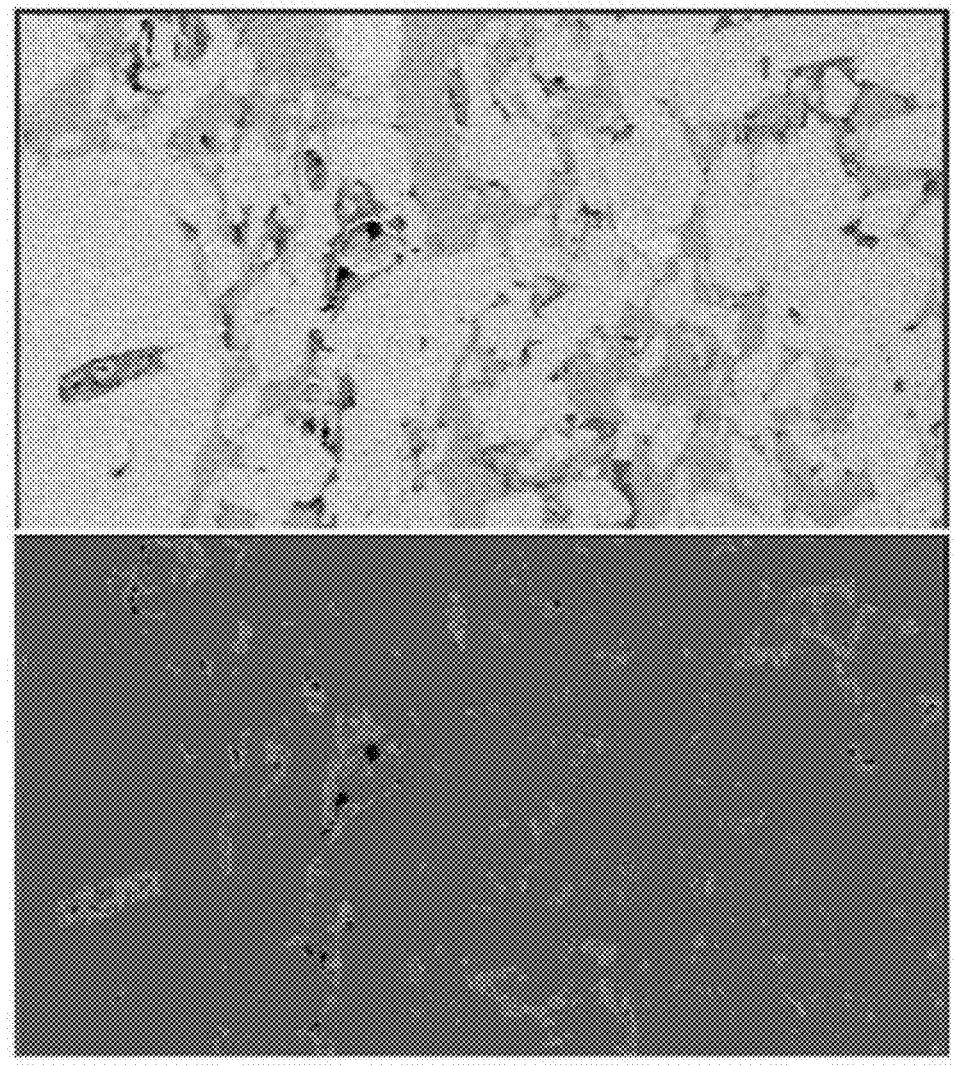

FIG. 10A
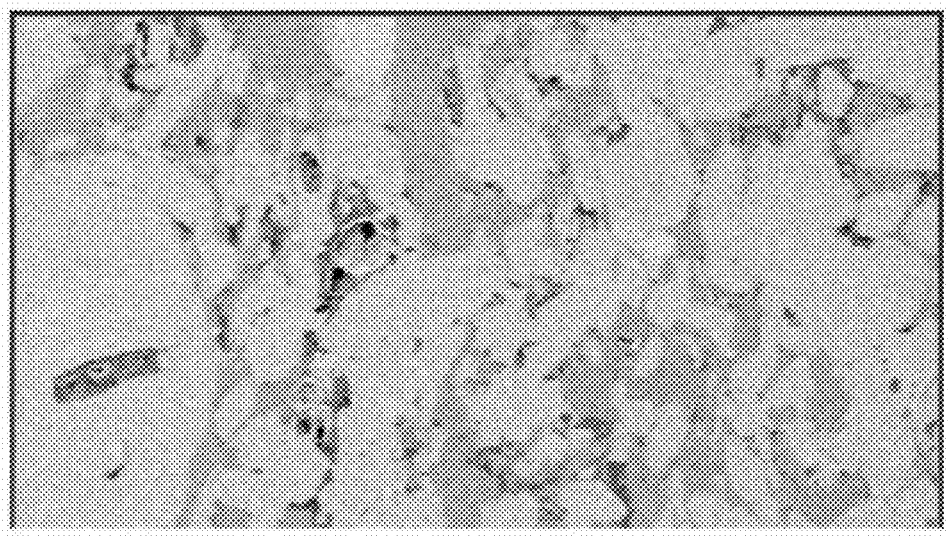
FIG. 10B

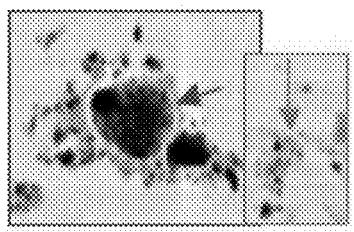
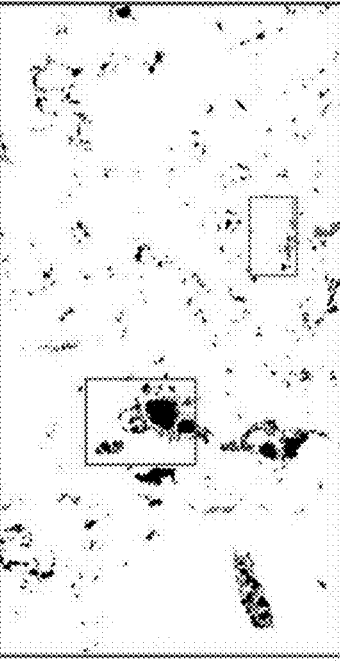
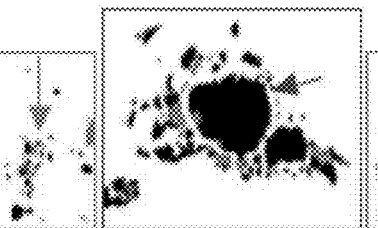
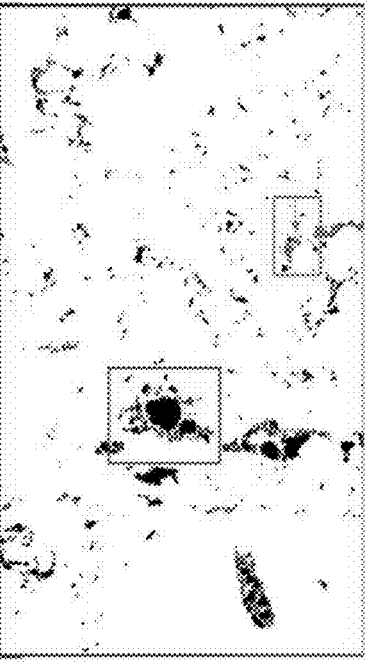
FIG. 11A   FIG. 11B   FIG. 11C   FIG. 11D   FIG. 11E   FIG. 11F   FIG. 11G   FIG. 11H   FIG. 11I

FIG. 13

Table 1: Comparison of Manual method and Inventive method

| Sample | Manual Method | | Inventive Method | |
| --- | --- | --- | --- | --- |
| | Porosity | Kerogen | Porosity | Kerogen |
| 1 | 0.0077 | 0.0090 | 0.0116 | 0.0077 |
| 2 | 0.0488 | 0.0260 | 0.0668 | 0.0140 |
| 3 | 0.0112 | 0.0110 | 0.0191 | 0.0150 |
| 4 | 0.0135 | 0.0740 | 0.0273 | 0.0173 |
| 5 | 0.0231 | 0.0590 | 0.0361 | 0.0283 |
| 6 | 0.0089 | 0.0390 | 0.0151 | 0.0207 |
| 7 | 0.0246 | 0.0220 | 0.0284 | 0.0314 |
| 8 | 0.0491 | 0.2950 | 0.0706 | 0.2355 |
| 9 | 0.0562 | 0.1230 | 0.0621 | 0.1256 |

All values expressed as volume fractions

DUAL IMAGE METHOD AND SYSTEM FOR GENERATING A MULTI-DIMENSIONAL IMAGE OF A SAMPLE

This application claims the benefit under 35 U.S.C. §119 (e) of prior U.S. Provisional Patent Application No. 61/547,090, filed Oct. 14, 2011, which is incorporated in its entirety by reference herein.

BACKGROUND OF THE INVENTION

The present invention relates to a method for generating a multi-dimensional image of a sample. The present invention also relates to a system for generating the multi-dimensional image of a sample.

Three-dimensional data acquisition and volume visualization through the application of serial FIB (Focused Ion Beam) sectioning has recently emerged as a potential method to acquire, interrogate, and display multi-dimensional images for various substrate materials. For example, in U.S. Pat. Nos. 6,855,936 and 7,750,293 B2, certain systems are described which can be used for FIB-SEM (Scanning Electron Microscope) three dimensional imaging methods. The FIB system can act like a nanoscale scalpel to remove very thin slices of material from a sample, while the SEM captures images of the sample's structure at each slice. Factors which may limit wider utilization of FIB-SEM based three dimensional imaging methods include challenges in implementing rapid and accurate image data analysis and image volume generation methods for the images captured with these devices.

In the field of digital rock physics, devices for generating computer tomographic (CT) images of rock samples, such as drill cuttings, have become available and used to analyze the rock samples. Such CT image generating devices have been used to produce two-dimensional gray scale images of the rock samples. The two-dimensional images can be stacked into a three-dimensional volume. Such gray scale images have been used, for example, as part of an analysis to obtain estimates of petrophysical parameters of the imaged rock sample, for example, porosity, permeability, shear and bulk moduli, and formation resistivity factor.

The present investigators have recognized that it would be beneficial to generate ultra-high resolution multi-dimensional images of rocks or other materials in combination with powerful automated analytical capabilities for image alignment and corrections to enable accurate and consistent nanoscale analysis of hydrocarbon deposits in rock or other samples. This development could permit rapid and accurate understandings of a rock sample, such as in terms of the geological phase content and distribution for any individual two-dimensional slices and the three-dimensional volume as a whole without need of laboratory analysis of the sample and with reduced reliance or need of human or manual analysis as part of the methodology. The present investigators further have recognized that there is a need for unique digital image capture and analysis methods which can provide accurate understandings in a short period of time for unconventional or "tight" fine grained formation rocks. Tight formations can have extremely low permeability unlike more typical sandstones or other more porous rocks which have been analyzed using digital rock physics.

SUMMARY OF THE INVENTION

A feature of the present invention is to provide a method for generating a multi-dimensional image of a sample, which includes capturing multiple two-dimensional substrate images of a surface region of the sample with different image capturing modalities having different accuracies, and generating an adjusted image using the different captured images.

Another feature of the present invention is to provide a method of creating a three-dimensional volume by simultaneously capturing dual sets of surface electron two-dimensional substrate images and backscatter electron two-dimensional substrate images, and generating a three-dimensional substrate volume from the surface electron two-dimensional substrate images using the alignment of the plurality of backscatter electron substrate images.

An additional feature of the present invention is to provide a method for generating a three-dimensional volume of a sample which includes scanning a surface of a sample containing multiple phases by a primary electron beam generated by an electron source, and recording separate image data based on detected surface electrons and backscattered electrons emitted by the sample during the scanning and storing of the image data as a dual set of image data associated with the scanned surface, removing a slice from the sample and repeating the image capture for a plurality of times, and then correcting at least one phase in the images based on detected surface electrons using identifications of a different phase that are identified in the images based on detected backscattered electrons emitted by the sample during scanning.

A further feature of the present invention is to provide a method for generating a three-dimensional volume of a sample which includes the scanning of a surface of a sample which comprises kerogen, porosity, and minerals wherein pixels are reallocated from kerogen to pore space in an analyzed two-dimensional image which has been captured based on detected surface electrons using a first mask, and pixels are reallocated from mineral to kerogen in the base analyzed two-dimensional image using a second mask.

Another feature of the invention is to provide a system for implementing the indicated methods.

Additional features and advantages of the present invention will be set forth in part in the description that follows, and in part will be apparent from the description, or may be learned by practice of the present invention. The objectives and other advantages of the present invention will be realized and attained by means of the elements and combinations particularly pointed out in the description and appended claims.

To achieve these and other advantages, and in accordance with the purposes of the present invention, as embodied and broadly described herein, the present invention relates in part to a method for generating a multi-dimensional image of a sample wherein the method includes capturing a first two-dimensional substrate image of a surface region of the sample with a first image capturing modality, wherein locations of at least one material at the surface region are captured. A second two-dimensional substrate image of the surface region is captured with a second image capturing modality which is different from the first image capturing modality. The second image capturing modality can provide greater accuracy with respect to locations of at least one material at the surface region than the first image capturing modality. The first two-dimensional substrate image is spatially aligned based on the second two-dimensional substrate image, and then a first corrected two-dimensional substrate image can be generated based at least in part on the locations of the at least one material in the second two-dimensional substrate image. As an option, the first corrected two-dimensional substrate image comprises a first material content determined by the second modality which is not obscured by charging issues with respect to identifying that first material than when measured with the first modality, and a porosity content of the sample is determined by the first modality which has higher accuracy with respect to identifying porosity in the first two-dimensional image than the second modality. As another option, the corrected two-dimensional substrate image is provided by altering the first two-dimensional substrate image with at least one digital mask wherein the locations of at least one of sample porosity and organic content determined for the first two-dimensional image by the first modality is corrected using at least one mask formed with reference to one or more of the locations of the organic content identified in the second two-dimensional substrate image.

The present invention further relates in part to a method of creating a three-dimensional volume wherein the method includes capturing a plurality of surface electron two-dimensional substrate images and a plurality of backscatter electron two-dimensional substrate images. An alignment of the plurality of backscatter electron substrate images is determined for generating a three-dimensional volume. A three-dimensional substrate volume is generated from the surface electron two-dimensional substrate images using the alignment of the plurality of backscatter electron substrate images.

The present invention further relates in part to a method for generating a three-dimensional digital image of a sample wherein the method has steps which include a) scanning a surface of a sample which comprises kerogen, porosity and mineral by a primary electron beam generated by an electron source, and (i) recording first image data based on detecting surface electrons of the sample and storing the first image data as a first two-dimensional image comprising a value of gray scale allocated to each of a plurality of pixels in the image, and (ii) recording second image data based on detecting backscattered electrons emitted by the sample during the scanning and storing of the second image data as a second two-dimensional image comprising a value of gray scale allocated to each of a plurality of pixels in the image. The first and second two-dimensional images provide a dual set of image data associated with the scanned surface. In a step b), a layer is removed from the sample by an ion beam directed at the sample to provide a different exposed surface on the sample. In a step c), the different exposed surface of the sample is scanned by the primary electron beam, and steps a)(i) and a)(ii) are repeated to provide a dual set of image data associated with the different exposed surface. In a step d), steps b) and c) are repeated for a plurality of times. In a step e), a plurality of the dual sets of image data obtained from steps a) and d) are stacked by positioning the respective first and second two-dimensional images in a same sequential order as obtained from the sample. In a step f), the first two-dimensional images are aligned by reference to the second two-dimensional images. In a step g), the first and second two-dimensional images of the plurality of dual sets of image data are analyzed with allocating of the pixels to pore space, kerogen, or mineral to form analyzed first and second two-dimensional images. In a step h), pixels allocated to kerogen in the analyzed first two-dimensional images which are not allocated to kerogen in the analyzed second two-dimensional images are identified in the dual set of image data. In a step i), the pixels identified in step h) are reallocated to pore space in the analyzed first two-dimensional images associated with the dual set of image data.

The present invention further relates in part to a method for generating a three-dimensional digital image of a sample wherein the method includes the indicated steps a)-f) herein, and the additional steps of g)-j) wherein dual masks are generated and used to correct the first two-dimensional images. In step g) of this method, the first two-dimensional images of the plurality of dual sets of image data are base analyzed comprising segmenting the pixels to pore space, kerogen, or mineral to form base analyzed first two-dimensional images. In a step h), the second two-dimensional images of the plurality of dual sets of image data are first analyzed comprising selecting only pixels which have gray scale values exceeding a preselected gray scale threshold value for kerogen to define a first mask. In a step i), the second two-dimensional images of the plurality of dual sets of image data are additionally analyzed comprising selecting only pixels which have gray scale values below a preselected gray scale threshold value for a mineral to define a second mask. In a step j), the base analyzed first two-dimensional images are altered by the first mask and the second mask. Pixels are reallocated from kerogen to pore space in the base analyzed first two-dimensional images using the first mask, and pixels are reallocated from mineral to kerogen in the base analyzed first two-dimensional images using the second mask.

The present invention further relates in part to a system for generating a three-dimensional digital image of a sample including a charged particle microscope, first and second signal processing systems, and a computer. The charged particle microscope includes a scanning electron beam column comprising an electron source for generating a primary electron beam, an ion beam column for generating a focused ion beam across a sample to successively remove a thin layer thereof in the direction of thickness of the sample and expose a different surface of the sample for scanning by the primary electron beam, a first charged particle detector for detecting surface electrons of the sample when scanned with the primary electron beam, and a second charged particle detector for detecting electrons backscattered by the scanned sample. The first signal processing system is operable for recording first image data based on surface electrons of the sample detected by the first charged particle detector and storing the first image data as a first two-dimensional image comprising a value of gray scale allocated to each of a plurality of pixels in the image. The second signal processing system is operable for recording second image data based on electrons backscattered by the sample during the scanning which are detected by the second charged particle detector and storing the second image data as a second two-dimensional image comprising a value of gray scale allocated to each of a plurality of pixels in the image. The first and second two-dimensional images provide a dual set of image data associated with the different exposed surface. The computer has at least one processor operable for executing a computer program capable of performing computations for creating a three dimensional digital representation of the sample. The computations include i) stacking a plurality of the dual sets of image data acquired by the first and second processing systems by positioning the respective first and second two-dimensional images in sequential order as obtained from the sample in alignment, ii) base analyzing the first two-dimensional images of the plurality of dual sets of image data comprising allocating the pixels to pore space, kerogen, or mineral to form base analyzed first two-dimensional images, iii) first analyzing the second two-dimensional images of the plurality of dual sets of image data comprising selecting only pixels which have gray scale values exceeding a preselected gray scale threshold value for kerogen to define a first mask, (iv) second analyzing the second two-dimensional images of the plurality of dual sets of image data comprising selecting only pixels which have gray scale values below a preselected gray scale threshold value for mineral to define a second mask, and (v) altering the base analyzed first two-dimensional images by the first mask and the second mask, comprising reallocating pixels from kerogen to pore space in the base analyzed first two-dimensional images using the first mask and reallocating pixels from mineral to kerogen in the base analyzed first two-dimensional images using the second mask.

It is to be understood that both the foregoing general description and the following detailed description are exemplary and explanatory only and are only intended to provide a further explanation of the present invention, as claimed.

The accompanying drawings, which are incorporated in and constitute a part of this application, illustrate some of the embodiments of the present invention and together with the description, serve to explain the principles of the present invention. The drawings are not necessarily drawn to scale. Like numerals in the drawings refer to like elements in the various views.

BRIEF DESCRIPTION OF THE DRAWINGS

FIG. 6 is a block diagram showing various steps in a method according to an example of the present invention.

FIG. 7A shows an SE2 image and FIG. 7D shows an ESB image which were acquired simultaneously for the same surface region of a sample and are spatially aligned.

FIGS. 7B and 7C are images that are magnified regions marked on FIG. 7A with corresponding shapes. FIGS. 7E and 7F are images that are magnified regions marked on FIG. 7D with corresponding shapes, according to an example of the present invention.

FIGS. 8A-8F include FIGS. 8A-8C which correspond to FIGS. 7A-7C and FIGS. 8D-8F show the images after a base segmentation is performed on the images. Some of the pore space (black) that is mislabeled as kerogen (grey) in the SE2 data is indicated by the arrow pointing to the upper left direction in FIGS. 8A, 8B, 8D and 8E, and some of the kerogen (grey) that is mislabeled as mineral (white) is indicated by the arrow pointing horizontally to the left direction in FIGS. 8A, 8C, 8D and 8F, according to an example of the present invention.

FIGS. 9A-9B include FIG. 9A which corresponds to FIG. 7D, and FIG. 9B shows an example of a mask created to re-label kerogen as pore in locations where signal is being read from inside the pore. The ESB of FIG. 9A is segmented so that all the values and only the values above those which represent real kerogen in the SE2 image are selected, which are indicated by the "sea" areas in FIG. 9B, according to an example of the present invention.

FIGS. 10A-10B include FIG. 10A which corresponds to FIG. 7D, and FIG. 10B shows of an example of a mask created to re-label mineral as kerogen in locations where the kerogen has charged. The ESB in FIG. 10A is segmented so that all of the values and only the values below those which represent real mineral in the SE2 image are selected, which is indicated by the shading added in FIG. 10B, according to an example of the present invention.

FIGS. 11A-11I includes three sets of images which show the effect of the two masks created from the ESB image on the resultant segmentation. The SE2 data set in FIGS. 11A-11C correspond to FIGS. 8A-8C, FIGS. 11D-11F correspond to FIGS. 8D-8F, and the base segmentation modified by the two masks is shown in FIGS. 11G-11I, and the arrows indicate the same mislabeled phases as indicated before in FIGS. 8A-8F, according to an example of the present invention.

FIG. 13 includes Table 1 which shows results for determining kerogen and porosity content for FIB-SEM scanned slices of shale samples using a method according to an example of the present invention and a comparison method including manual analysis of the image content.

DETAILED DESCRIPTION OF THE PRESENT INVENTION

Figure 1:
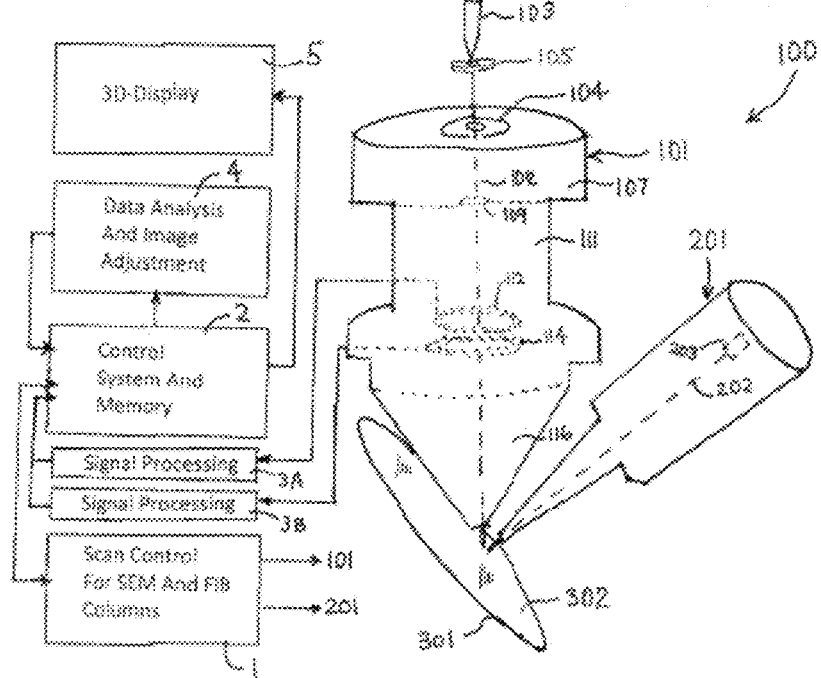
FIG. 1 is a schematic representation of a system according to an example of the present invention.

The present invention relates in part to a method for generating a multi-dimensional image of a sample which combines different image capturing modalities with data analysis capability for identifying and integrating the higher accuracy image features captured by each respective modality to yield reconciled image data of higher accuracy and consistency than possible from either modality alone. The method of the present invention can be particularly useful, for example, for generation of digital images of samples which contain different phases that are not image-captured at the same levels of accuracy by a single high resolution image capture modality. Recognizing this problem, a method of the present invention includes simultaneous capture of dual sets of image data for the same surface of a sample using different image capturing modalities. The different image capturing modalities form part of a dual signal generation, acquisition, analysis, and digital image display system. As an option, at least one of the modalities can provide higher identification accuracy for at least one image feature in comparison to the other image capture modality or modalities. Corrected images can be generated from the identifications of different features with the corresponding modality that provides the higher identification accuracy for the given feature. Rock samples, for example, can have one or more kinds of solid material (e.g., inorganic material, organic material, or combinations of these phases) and possibly pore space. When multi-phase materials are viewed under a scanning electron microscope or other very high resolution image capture device, for example, a surface electron or secondary electron detector of a SEM, for example, can generate signals which provide two-dimensional gray scale images that can display pore space with high accuracy at the given slice level. These scans also may capture signals from solid material inside the pore space at a location that belongs in a subsequent or deeper slice of the sample, which can create identification errors for the image. Unless corrected by a present method, the misidentified solid material from the deeper slice can misleadingly appear in the two-dimensional image as occupying space in the same two-dimensional slice as the pore through which it is detected. Further, some organic content of rocks, such as kerogen, also may charge into the mineral phase during SEM scanning and become misidentified as mineral in the two-dimensional image. Accordingly, reliance on captured surface electron imaging alone can result in incorrect determinations of the pore space and solid material or materials for a sample slice. When two-dimensional images are stacked into a single three-dimensional volume, these identification errors can be compounded, if not corrected by the present method. The present method can provide such modes of correction in highly automated routines that are more accurate, rapid, and repeatable than reliance on manual analysis and processing of the images.

As an option, a method of the present invention can determine phase distribution content in organic content-containing rock wherein a corrected two-dimensional substrate image can be generated that comprises organic content of interest determined by a modality having higher accuracy with respect to the organic content, and any porosity content is determined by a different modality having higher accuracy with respect to porosity in a two-dimensional image that was aligned using the second two-dimensional substrate image. As another option, a method of the present invention provides a second image capture modality which can identify at least one kind of solid material with a high level of accuracy at the same slice level, and these more accurate identifications can be used to correct at least one of misidentifications of the solid material in the first image which are actually pore space and misidentifications of the solid material as a different kind of solid material.

The present method can be applied to the generation and correction of individual two-dimensional images. The method also can be applied to the generation and correction of multiple two-dimensional images that are obtained from successive slices of a sample, and the corrected images in stacked alignment provide a high accuracy three-dimensional volume simulation of the scanned portion of the sample.

As indicated, the present method can be implemented in a highly automated manner in a relatively short period of time. The present method can avoid the need for correcting the slices by hand one slice at a time. A manual process can be very time consuming, unrepeatable, and inaccurate such as shown in the examples included herein. Further, with manual marking corrections, the results can highly depend on the individual making the manual corrections. The present method reduces the opportunity for such errors to arise and adversely affect the simulated image results.

As an option, a method of the present invention relates to creating a three-dimensional display of the volume of a sample wherein the indicated different image capture modalities comprise a modality for capturing a plurality of surface electron two-dimensional substrate images, and a different modality which can comprise a modality for capturing a plurality of backscatter electron two-dimensional substrate images that are used to correct the surface electron two-dimensional substrate images. After determining an alignment of both sets of the images based on the plurality of backscatter electron substrate images, a three-dimensional substrate volume comprised of corrected images can be generated from the surface electron two-dimensional substrate images including corrections made for misidentified features with reference to the backscatter electron substrate images.

As an option, the different modality can comprise capturing a plurality of energy dispersive spectrometer (EDS) substrate images.

As an option, a method for measuring porosity and organic content in rock or mineral specimens is provided that can integrate slice-by-slice three dimensional image data acquisition capabilities with powerful image analytical capabilities in a highly automated manner. To determine porosity and kerogen or other organic content fractions in a rock sample, a charged particle microscope equipped for multiple signal detection modalities can be used for generating three dimensional data of the sample as dual sets of image data. The dual sets of image data can provide different levels of accuracy as to imaging the different features in the sample, wherein the dual sets of data can be aligned, analyzed, and merged or integrated in the present methods to yield unique images of high accuracy and consistency for the sample. A rock or mineral material, for example, that can be analyzed by the method is not necessarily limited. The rock can be, for example, shale, mudstone, siltstone, claystone, porcelanite, dolomite, or a combination thereof. Shale is referenced in some descriptions provided herein for sake of illustration and not limitation. The method can be applied, for example, to unconventional or "tight" fine grained formation rocks and minerals. The tight formation materials can have extremely low permeability, such as less than about 0.1 milliDarcy of absolute permeability, or could even lack porous networks of flow paths. The rock can include mineral material, such as crystalline solid material or mineral. As an option, the organic content can comprise kerogen. Kerogen is a mixture of organic chemical compounds that make up a portion of the organic matter in some rocks, such as sedimentary rocks. Kerogen typically is insoluble in normal organic solvents because of the very large molecular weight (e.g., upwards of 1,000 Daltons) of its component compounds. When heated, some types of kerogen can release crude oil or natural gas. In an option of the present method, the rock can be scanned slice-wise by a FIB-SEM device which simultaneously generates multiple signals that can be processed and formed into separate sets of gray scale images that yield different results for identification of mineral (e.g., grain), organic content (e.g., kerogen), and any pore space content of the slices of the rock or other scanned sample.

As an option, to determine the locations and fractions of different phases in a sample, such as a rock sample, a focused ion beam-scanning electron microscope (FIB-SEM) equipped for multiple detection modalities can be used to produce two-dimensional (2D) images at different slices of the sample at very high resolution. A charged particle beam system 100 is shown in FIG. 1 to illustrate a FIB-SEM system that can be used for this option. The charged particle beam system 100 comprises a scanning electron beam column 101 and a focused ion beam column 201. As shown in FIG. 1, the optical axis 102 of the electron beam column 101 and an optical axis 202 of the focused ion beam column 201 intersects substantially in a plane defined by the planar surface 302 of a sample 301. In this illustration, the optical axis 202 of the focused ion beam column 201 extends approximately perpendicularly to this plane of the sample 301 and the ion beam therefore impinges orthogonally on this surface in this example. The angle at which the electron beam traveling along the optical axis 102 of the SEM column 101 impinges on the surface 302 of the sample 301 in this configuration can be a conventionally used value, such as about 30° to about 40°, or other suitable values. In the scanning electron beam column 101, a primary electron beam can be generated by an electron source 103, such as a Schottky field emitter, and an anode 104. The emitted electrons also can pass through an extractor electrode 105 disposed between the electron source 103 and the anode 104. The accelerated electron beam then can pass through a bore at the bottom of the anode 104 and is substantially collimated by a collimator system 107 and then passes through an aperture stop 109 and an inner space 111 of the electron beam column 101. The system described to this point can comprise components shown in a system such as in U.S. Pat. No. 7,770,293 B2, which is incorporated herein by reference with respect to these and other details of the design of the electron optical system and the ion optical system. A detector 112 for secondary or surface electrons and a separate detector 114 for backscattered electrons are arranged in inner space 111 through which the accelerated electron beam passes. Following in the beam direction of the electrons, an objective lens 116 then can be provided which can be a combination of a magnetic lens and an electrostatic lens, which can have features such as described in the above-incorporated patent. The focused ion beam column 201 can comprise an ion source 203 and other components such as described in the above-incorporated patent capable of generating an ion beam which also can be impinged on the surface 302 of sample 301.

At the left side of FIG. 1, some control elements 1-5 of the system 100 are shown. A scan control 1 can generate a scanning signal which is applied to the electron beam column 101 and the same or a separate scan control (not shown) can generate a scanning signal which is applied to the FIB column 201. The signal of the scan control 1 also can be applied to a data memory 2 and can trigger the data memory 2. The data memory 2 can have adequate capacity to store a plurality of simultaneously captured dual image data sets. Secondary and backscattered electrons emitted by the sample 301 because of the primary electron beam can be accelerated by components of the objective lens 116 of the scanning electron beam column 101 in the direction of the optical axis of the electron beam column 101 and can be detected by the detectors 112 and 114. The separate signals detected by detectors 112 and 114 can be amplified or otherwise enhanced by respective signal processing units 3A and 3B, and stored in data memory 2 in combination with assigned information from the scan control 1. Thin slices can be removed from the sample 302 using focused ion beam column 201. By deflecting the focused ion beam, for example, in a direction perpendicular to the plane which is defined by the optical axis of the electron beam column 111 and the optical axis of the ion beam column 201, using the scan control 1, thin slices can be removed from the sample 302. Simultaneously, image data are generated by using the scanned electron beam and detecting secondary and backscattered electrons with the detectors 112 and 114, respectively. The image data generated by the electron beam column within the time in which one slice is removed defines one image data set, and each detector 112 and 114 captures signals for a respective image data set. By repeatedly removing one slice after the other and continuously generating image data a plurality of dual sets of image data are recorded and stored in the memory 2. For scanning electron microscopes (SEM), the scanners typically output two-dimensional arrays of values representing the gray scale values from the scanner. In a further step, the plurality of sets of image data stored in memory 2 are evaluated in a data analysis and image adjustment unit 4. Regarding the analysis and image adjustment, reference is made to FIGS. 3-13 herein. After the analysis and image adjustment have been performed, the results can be stored in memory 2 and sufficient information can be available to generate high resolution 3D image displays of the results on a display 5, including according to usual and known display methods are available.

Figure 2:
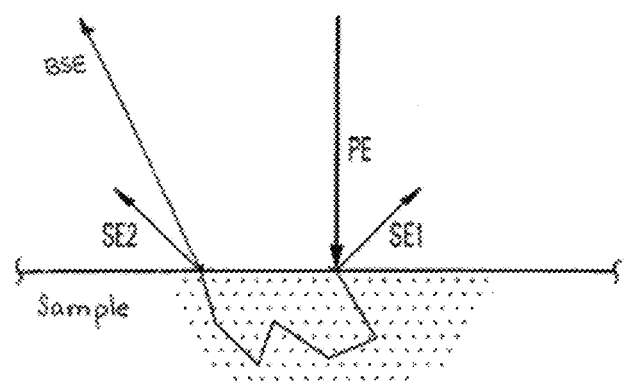
FIG. 2 is a schematic illustration of secondary electrons and backscatter electrons generated by a primary electron beam that is directed on a sample surface.

As indicated, a feature of this option is the provision of simultaneous detection capability for secondary or surface electrons and backscatter electrons for producing respective dual signals for capture and generation of dual sets of image data based on each mode of detection. A secondary electron detector, for example, can be used to detect signals that result from interactions of the electron beam with atoms at or near the surface of the sample. As illustrated in FIG. 2, primary electrons of a primary electron beam ("PE") impinging on a surface of a sample at a beam spot can release a secondary electron by an inelastic interaction, which can be referred to as "SE1." Primary electrons also can penetrate into the sample, undergo plural elastic interactions within a so-called interaction volume very near the surface of the sample, and emerge from the sample at a distance from the beam spot as backscattering electrons, which can be referred to as "BSE" or "ESB." Furthermore, secondary electrons can be released from the sample as the backscattered electrons emerge from the sample, which also can emerge from the sample at a distance from the beam spot, and these secondary electrons can be referred to as "SE2." Backscattered electrons may impinge on the outside of the SEM lens, for example, to release additional secondary electrons, sometimes referred to as "SE3" (not shown in FIG. 2). The concepts of BSE, and SE1, SE2, and SE3 types of secondary electrons are generally known. These BSE typically have higher energy level and other differences with respect to the secondary electrons, and these differences can be exploited to separately detect them. As an option, the detection of secondary electrons in methods of the present invention relates to detection of "SE2" secondary electrons. In this option, the dual sets of image data can be based on detection of signals for BSE and SE2 electrons. The scattering process and mechanisms occurring in the interactive volume very near the surface of the sample can be different for different materials and can depend, for example, on the composition and structure of the material. As indicated, simultaneous detection of secondary and backscattered electrons is provided in a present method so that dual sets of image data can be captured for each slice of the sample.

Further, as indicated, after dual sets of images are captured for a given slice of the sample, the focused ion beam of the FIB-SEM can be used to remove a thin layer from the surface of the sample and another dual set of image data can be captured on the newly exposed surface. The thin layer removed with the FIB can be, for example, from about 1 nm to about 30 nm, or from about 1 nm to about 20 nm, or from about 1 nm to about 15 nm, or from about 1 nm to about 10 nm, or from about 1 nm to about 5 nm, or from about 2 nm to about 4 nm, or other values. A FIB-SEM system that can be adapted for use in the indicated method can be commercially obtained, for example, as a model referred to as the AURIGA® CROSSBEAM® FIB-SEM workstation from Carl Zeiss SMT AG (Oberkochen, Germany). As an alternative option, one of the indicated surface electron and backscatter electron detectors can be replaced by a detector for detecting x-ray signals emitted by the sample, such as an energy dispersive spectrometer ("EDS"), and storing the image data as an alternative set of image data in addition to the surface electron-based image data or the backscatter electron-based image data.

Many images can be sequentially obtained in these methods and then combined by stacking and aligning them in the proper position, to create a preliminary three-dimensional (3D) volume. The scan image output produced by a SEM scanner can be a 3D numerical object including a plurality of 2D slices or sections of the imaged sample. Each 2D slice can include a grid of values each corresponding to a small region of space defined within the plane of the grid. Each such small region of space is referred to as a "pixel" and has assigned thereto a number representing the image intensity (or for example the density of the material as determined by the CT scan procedure).

The process by which the two-dimensional images are stacked and aligned is not trivial. The gray scale images can be stacked and aligned, for example, with data visualization and analysis software adapted for use in the present methods. Stacking can be done, for example, by sequentially positioning the images of the slices in the order they were obtained from the sample. Alignment can rely on processing techniques which identify the correct lateral position of one slice relative to the next in the same stack. As an option, the two-dimensional substrate image or images obtained based on surface electron detection can be aligned by reference to the two-dimensional substrate image or images obtained with backscatter electron detection. For example, locations of kerogen in a two-dimensional substrate image obtained with the backscatter electron detection can be highly accurate and can be used to align the two dimensional substrate image or images captured from backscatter electron detection and also simultaneously captured two-dimensional substrate image or images obtained from surface electron detection on the scanned sample. The backscatter electron data typically contains fewer artifacts for rock samples such as shale, and those two-dimensional images can be used to more easily align the slices and create a three-dimensional volume. For example, since the kerogen locations can be more accurately displayed in the backscatter electron substrate images captured on rock samples, and more so than in the surface electron substrate images, the kerogen sites in the backscatter electron substrate images can be used to align the counterpart surface electron substrate image which was captured at the same time with the FIB-SEM system. With the alignment determined from backscatter electron data, the surface electron data can be manipulated identically. The identified locations of kerogen can be used to laterally (X-Y directions) align a two-dimensional substrate image of the sample which has been simultaneously acquired by surface electron detection. Where a three-dimensional volume of images are to be generated based on successive scans and captures of dual set of image data at each slice, alignment also can be based on the kerogen locations identified in the two-dimensional substrate images captured from backscatter electron detection for each slice where nanoscale or other very small slice thicknesses are used in generating the stacks of two-dimensional images for successively scanned slices of a sample. Using small slice thicknesses, kerogen sites that propagate through adjoining slices of the images obtained from backscatter electron detection can be identified and used as a point or points of reference for aligning that stack and the separate stack of slices comprising images obtained with surface electron detection. The kerogen locations in the images obtained by backscatter electron detection can be used to laterally align the simultaneously captured images with each other, and the images of the adjoining slices. This alignment process can be performed slice-by-slice for a stack of successively acquired dual sets of images for the sample. Using the present alignment method, the surface electron images can be aligned without the extra processing that would have otherwise been required. As another option, physical registration or fiduciary marks can be created on the surface of the sample being imaged for alignment purposes, such as described, for example, in U.S. Pat. No. 7,750,293 B2.

For purposes herein, "segmentation" means a process of partitioning a digital image into multiple segments (sets of pixels). Image segmentation is typically used to locate objects and boundaries (lines, curves, etc.) in images. In segmentation of porous rock, for example, it can be used to allocate pore space and one or more non-porous phase regions and their boundaries. Image segmentation is the process of assigning a label to the pixels in an image such that pixels with the same label share certain visual characteristics. The result of image segmentation is a set of segments that collectively cover the entire image, or a set of contours extracted from the image. Each of the pixels in a region can be similar with respect to some characteristic or computed property, such as color, intensity, or texture. Adjacent regions are different with respect to the characteristic(s). General-purpose algorithms and techniques have been developed and used for image segmentation in the field of digital image processing. For example, a digital image of a rock sample can be segmented into its compositional classes. The term "compositional classes" can encompass, for example, open pores, mineral(s), optionally other types of materials, or any combinations thereof. Members of a single compositional class should possess the same composition and the same general structure relative to other compositional classes so that they influence to a similar extent the properties of the rock. As known in the field, there can be ambiguity in segmenting x-ray attenuation images (to use the X-ray microtomography example) into compositional classes of similar mineralogy because different rock minerals can have similar x-ray attenuations. Segmentation can be greatly aided if prior information about the mineral composition of the sample limits the number of possibilities for each pixel. As also known, where there is no prior information, x-ray diffraction can be used to determine mineralogy. If two compositional classes have equal or nearly equal x-ray attenuations, it may be necessary to use structural metrics to distinguish them as will be understood by those skilled in the art. Gray scaling is a non-limiting example. These and other segmentation methods and techniques may be applied or adapted for use in a method and system of the present invention.

As an example, after alignment, the dual sets of image data can be analyzed to allocate or segment pixels in the two-dimensional gray scale images to different phases (e.g., pore space, kerogen, or mineral in some rock samples) to form base analyzed two-dimensional images. The value ascribed to each pixel of the 2D slices is typically an integer that may vary, for example, between zero and 255, for example, where 0 is, e.g., pure black, and 255 is pure white. Such an integer is typically referred to as a "gray scale" value. In the example given, 0 to 255 can be associated, for example, with eight digital bits in a digital word representing the gray scale value in each pixel. Other gray scale ranges may be associated with longer or shorter digital words in other implementations, and the range of 0 to 255 is not intended to limit the scope of the invention. As an option, for the purpose of simulating a process using such a numerical object (the gray scale) for a rock sample, allocating of the pixels can comprise allocating the pixels in the images to pore space, kerogen, or mineral by determining if the pixel meets preselected threshold criteria based on gray scale values preselected for the pore space, kerogen, or mineral, respectively. The numerical object can be processed, for example, so that all of the pixels allocated to the void space in a rock sample (pore space) are represented by a common numerical value, e.g., by only zeros, and all of the pixels associated with the rock minerals or kerogen are represented by different (higher) numerical values, for example, a value or range value much closer to 255 for mineral, and an intermediate value or range value between that of mineral and pore for kerogen. A routine which can be used for the allocation can be, for example, a data visualization and analysis software adapted for the present method.

For rocks such as shale, for example, there can be great complexity in the features of the images. The images also can contain artifacts of the acquisition process that are not present in the actual sample. Thus, creating a three-dimensional image stack of a sample can be technically challenging without the present method. For example, where images are obtained only from a surface electron detector used in a FIB-SEM to create a three-dimensional volume from which porosity and kerogen or other organic content is quantified, the images created using the surface electron detector data alone can provide sharper edges on the pore spaces (porosity) than, for instance, from backscatter electron detector data. However, it has been found that there are typically more artifacts in the surface electron data that make three-dimensional alignment and quantification of kerogen or other organic content more difficult than when using a different modality, for example, backscatter electron data. For accurate porosity determination, then extra processing steps are needed to deal with the digital artifacts that can be present in the surface electron data. As indicated, manual corrections, however experienced the particular human image interpreter may be, are typically time consuming and require visual interpretation and personal judgment. The present method can overcome these problems associated with reliance on manual interpretation of images.

Figure 3A:
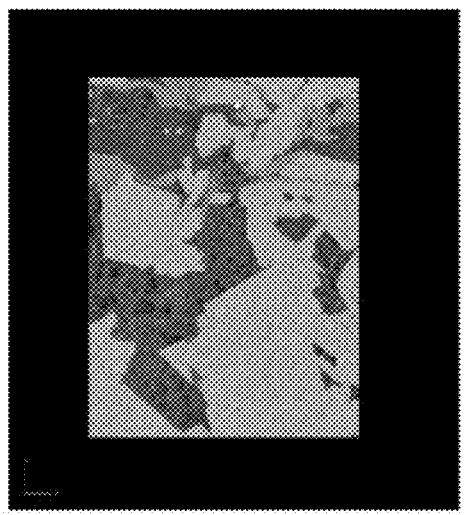
FIGS. 3A and 3B show two-dimensional gray scale images captured on a rock sample surface with an electron backscatter scan (also referred to herein as an "energy selected backscatter" scan ("ESB" scan) or backscatter electron scan ("BSE" scan) and a surface electron scan (also referred to herein as a secondary electron ("SE2") scan), respectively, of the same slice of the sample, according to an example of the present invention.
Figure 3B:
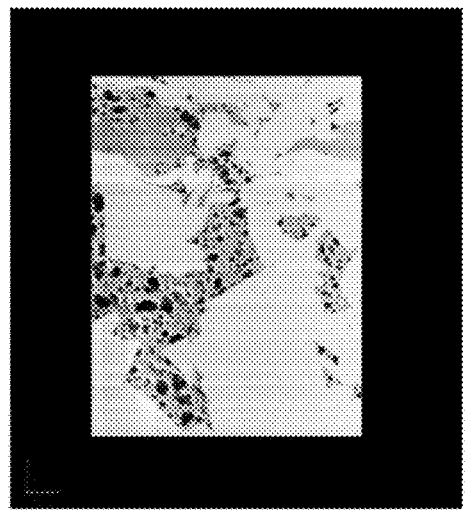
Figure 4A:
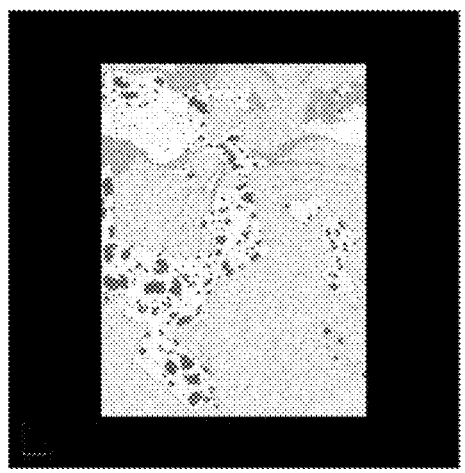
FIGS. 4A and 4B show segmentations of the kerogen phase for both the ESB and SE2 of the slices in FIGS. 3A and 3B, respectively, according to an example of the present invention.
Figure 4B:
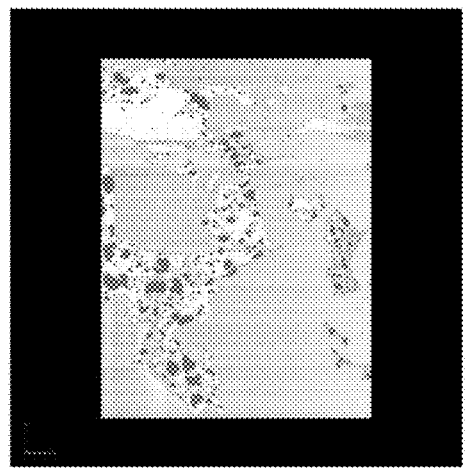
Figure 5A:
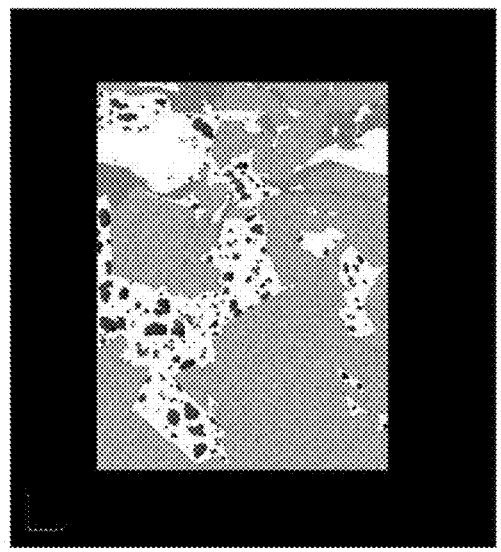
FIGS. 5A and 5B show segmented captured images generated from a method including a dual signal processing technique wherein kerogen segmentation from ESB data is shown in FIG. 5A and pore segmentation from SE2 data is shown in FIG. 5B, according to an example of the present invention.
Figure 5B:
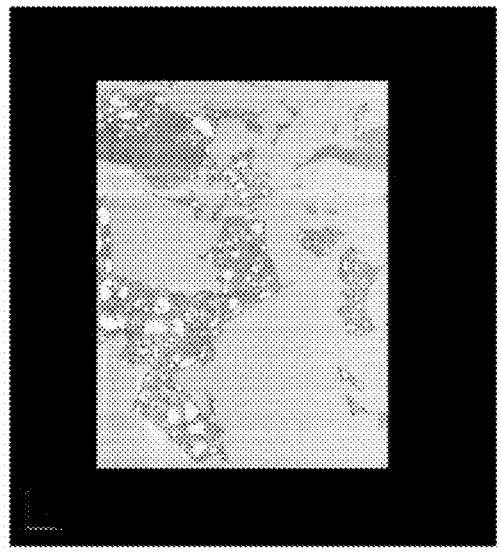

As an option, in a method of the present invention, kerogen fraction can be determined from the backscatter electron data and porosity fraction can be determined from surface electron data that was aligned using the backscatter electron image stack for any of the indicated simultaneously captured two-dimensional images of the dual data set acquired on the FIB-SEM. An illustration of the different results that can be obtained based on surface electron scans and backscatter electron scans of a same sample surface of a rock with a FIB-SEM device, and the computation of a corrected image result based on these differing data is shown, for example, in FIGS. 3A-3B, 4A-4B, and 5A-5B. FIGS. 3A and 3B show two-dimensional gray scale images which have been simultaneously captured on a rock sample surface (i.e., a shale surface) with an electron backscatter scan (ESB) scan) and a surface electron scan (secondary electron (SE2) scan), respectively, of the same slice of the sample using an AURIGA® CROSSBEAMS FIB-SEM workstation obtained from Carl Zeiss NTS GmbH. FIGS. 4A and 4B show separate ESB and SE2 segmentation images of the slices of FIGS. 3A and 3B, respectively. At this stage of the data analysis, the computed results for the ESB scan of FIG. 3A are porosity 1.8%, kerogen 22.1%, and absolute permeability 0 nD, and for the SE2 scan of FIG. 3B, they are porosity 5.6%, kerogen 16.6%, and absolute permeability 36/0/15 nD (x,y,z axis). Thus, the results for the ESB and SE2 scans do not agree. These results show that the ESB and SE2 scans can have significantly different capabilities to distinguish pores from kerogen in shale or other rock. FIGS. 5A and 5B show segmented captured images from a present method including a dual signal processing technique wherein kerogen segmentation from ESB data is shown in FIG. 5A and pore segmentation from SE2 data is shown in FIG. 5B. As an option, the kerogen content of the sample slice can be determined from only the kerogen segmentation from the backscatter electron (ESB) data (FIG. 5A) and the porosity can be determined only from the pore segmentation from the surface electron (SE2) data (FIG. 5B) that was aligned using the backscatter electron image stack. If this option is used, the computed and merged results for these two types of images acquired for the same slice of the sample are porosity 5.6% as based on the higher resolution determination of porosity from the surface electron data, kerogen 22.1% as based on the higher resolution determination of kerogen from the backscatter electron data, and absolute permeability 36/0/15 nD (x,y,z axis). The absolute permeability of the sample was determined by numerical simulation. Using the present method on a plurality of the indicated simultaneously captured two-dimensional images of the dual data set acquired on the FIB-SEM for a given scanned sample, volume fractions of kerogen, porosity, and for other phases of a rock can be more accurately determined. The method also can be applied to other types of samples, and is not limited to rock or mineral. Segmentation and data processing time can be reduced by this method. A further benefit of the method is that it is much faster, consistent, and accurate than methodology using manual analysis.

FIB-SEM images (SE2), for example, can become increasingly difficult to segment as the pore space becomes larger and signals are captured from solid material inside the pore space from a location that belongs in a subsequent slice. A non-corrected segmentation used to segment computer tomographic (CT) data sets typically labels this material as kerogen (or in a worse case, as mineral for materials that have charged or oriented near parallel to the milled surface) when it should be labeled as porosity. Kerogen, for example, can be mislabeled as mineral when it charges during scanning by a FIB-SEM device. Without the present method, these misidentifications would need to be corrected manually by hand one slice at a time. As indicated, a manual process is very time consuming, unrepeatable, and inaccurate. Results can highly depend on the individual making the manual corrections.

As another option, a method of the present invention can correct images captured as surface electron two-dimensional substrate images with at least one mask which can be developed from backscatter electron two-dimensional substrate images which are simultaneously captured for each slice. In this option, pixels can be reallocated from kerogen to pore space in the surface electron two-dimensional substrate images using a first mask. Additionally or alternatively, pixels can be reallocated from mineral to kerogen in the surface electron two-dimensional substrate images using a second mask. To correct pore misidentified as kerogen in the surface electron two-dimensional substrate images, such as where material inside a pore from a deeper slice appears in a kerogen gray scale range, inspection of a simultaneously acquired backscatter electron data set can be used to reveal areas in the surface electron two-dimensional substrate images where the pore is mislabeled as kerogen. For example, the backscatter electron data which is taken simultaneously with and aligned to the surface electron data reveals that in areas in which pore has been mislabeled as kerogen in the surface electron data that the backscatter electron data has a significantly higher gray scale value than areas labeled as kerogen that are correct. This indicates that these areas have higher gray scale values than would be expected of real kerogen. For example, with the first mask, actual pore can be assigned a high gray scale value as it appears white relative to real kerogen in the backscattered SEM images (e.g., about 190 to 240). For the second mask kerogen which has charged and mislabeled as mineral can be assigned a low gray scale value relative to the mineral phase as the kerogen can appear as a lower shade of gray relative to the mineral phase in the backscattered SEM images (e.g., about 0 to 115). A surface area in the surface electron data that appears significantly darker in shade and has a significantly higher gray scale value than the real kerogen in the backscatter electron data can be identified by comparing the kerogen identified in the surface electron data with that in the backscatter electron data. For example, the backscatter electron data set can reveal pore areas which have been misidentified as kerogen in the surface electron two-dimensional substrate images that have gray scale values that are higher than the areas correctly labeled as kerogen in backscatter electron two-dimensional substrate images. This difference can be exploited to correct the porosity mislabeled as kerogen in the surface electron two-dimensional substrate images while leaving locations of real kerogen unaffected. To correct kerogen misidentified as mineral in locations of the surface electron two-dimensional substrate images where the kerogen has charged into the gray scale range of mineral during scanning (e.g., the charged kerogen appears much lighter than normal in the images), the same backscatter electron data set used to correct the porosity can be used to make these corrections. For example, there can be areas of the segmented mineral phase in the surface electron data set that should be identified as kerogen but are not because these areas have a gray scale value that is above the gray scale range assigned to kerogen. These areas mislabeled as mineral in the surface electron data are found to have a significantly lower gray scale value in the backscatter electron data set than areas labeled as mineral that are correct. These areas in the surface electron data set appear significantly darker than actual mineral areas in the backscatter electron data set. For example, the backscatter electron data set can reveal kerogen areas misidentified as mineral in the surface electron two-dimensional substrate images that have gray scale values that are lower than the areas correctly labeled as mineral in backscatter electron two-dimensional substrate images. This difference can be exploited to correct the kerogen mislabeled as mineral in the surface electron two-dimensional substrate images while leaving real mineral unaffected.

In the block diagram of FIG. 6, the main process steps of a present method using dual masks to correct the dual set of image data is shown. In step 101, a surface of the sample is scanned, such as with a FIB-SEM as shown herein. In step 102, dual sets of image data signals of SEM images that are captured by multiple detectors, such as indicated herein, are recorded (e.g., during a scanning of the electron beam of the electron optical column in two directions perpendicular to its optical axis and detecting secondary and backscattered electrons). In a consecutive step 103, this dual set of image data is stored in an image memory. During the time the image data set is recorded in step 103, a slice can be removed from the sample in step 104, such as by dry etching or sputtering of the sample by the focused ion beam. These steps 101 through 104 are repeated for a desired number of times, which is denoted by recursive arrow 104A until a desired plurality of dual sets of image data are stored in the memory. After the desired number of dual sets of image data are recorded in step 103, the dual sets of images are stacks in step 105 and then aligned in step 106. In step 107, the images are analyzed (e.g., segmented) to preliminarily allocate phase locations in the images, such as, for example, to pore, kerogen, and mineral for some rock samples. In steps 108 and 109, masks are developed for correcting pore space that has been misallocated to kerogen and kerogen which has been misallocated to mineral. In step 110, alterations or corrections are made to one of the sets of images using the masks. After the above steps have been performed, sufficient information to generate high resolution 3D image displays according to usual and known display methods are available.

An example of a dual mask method of correcting digital images of a method of the present invention is provided with reference made to FIGS. 7-13. In this illustration, a shale rock is scanned with an AURIGA® CROSSBEAM® FIB-SEM workstation from Carl Zeiss SMT AG (Oberkochen, Germany). Other combinations of different scanning modalities can be used, including those indicated elsewhere herein. In this example, dual signals are simultaneously acquired with an SE2 detector and ESB detector that are used with the FIB-SEM device. Image data is recorded based on the detected surface electrons of the sample and stored as a two-dimensional image comprising a value of gray scale allocated to each of a plurality of pixels in the images. A separate set of image data is recorded based on the detected backscattered electrons emitted by the sample during the scanning and stored as two-dimensional images comprising a value of gray scale allocated to each of a plurality of pixels in the images. The two-dimensional images provide a dual set of image data associated with the scanned sample. The two-dimensional images obtained based on dual surface electron and backscatter electron detection each can be stacked and aligned in the previously mentioned manner or manners. The dual sets of image data can then be analyzed to allocate pixels in the two-dimensional gray scale images to pore space, kerogen, or mineral to form base analyzed two-dimensional images. Commercial data visualization and analysis software can be adapted for performing the analyzing, such as a computerized segmentation routine. The segmentation routine can be, for example, a tool or module of a data visualization and analysis software adapted to perform the analysis indicated herein.

As an option, routines are provided using the ESB data as a second image set to enhance the accuracy of the labeled pore and kerogen phases in the SE2 data as a primary image set. Two masks are created from the ESB data for two purposes. As one purpose, kerogen is re-labeled as pore in locations where material inside the pore from a deeper slice appears in the kerogen gray scale range. Close inspection of ESB data, which is taken simultaneously with and aligned to the SE2 data, reveals that in areas which pore has been mislabeled as kerogen, the ESB data has a significantly higher gray scale value than areas labeled as kerogen that are correct. As indicated, this difference is exploited to correct the porosity mislabeled as kerogen while leaving real kerogen unaffected. As another purpose, mineral is re-labeled as kerogen in locations where the kerogen has charged into the gray scale range of mineral during scanning, such as by a FIB-SEM device. As indicated, the same ESB data set used to correct the porosity can be used to correct the kerogen, wherein the segmented mineral phase that should be kerogen has a significantly lower gray scale value in the ESB data set than areas labeled as mineral that are correct. Kerogen mislabeled as mineral in the surface electron data is corrected while leaving real mineral unaffected.

For example, FIG. 7A shows an SE2 image and FIG. 7D shows an ESB image which were acquired simultaneously for the same surface region of the sample and are spatially aligned. FIGS. 7B and 7C are images that are magnified regions marked on FIG. 7A with corresponding shapes. FIGS. 7E and 7F are images that are magnified regions marked on FIG. 7D with corresponding shapes. The SE2 data set is segmented using a data visualization and analysis software to produce the base segmentation. The ESB data set is also segmented to produce the two masks which will be used to alter the base segmentation produced from the SE2 data set.

FIGS. 8A-8F include FIGS. 8A-8C which correspond to FIGS. 7A-7C and FIGS. 8D-8F show the images after the base segmentation is performed on the images. Some of the pore space (black) has been mislabeled as kerogen (gray) because of SE2 data being acquired from inside the pore space (e.g., see the arrow pointing at an angle towards the upper left direction in FIGS. 8A, 8B, 8D and 8E) and that some of the kerogen (grey) has been mislabeled as mineral (white) because it has charged during scanning (e.g., see the arrow pointing in the horizontal direction towards the left-hand side of the figure in FIGS. 8A, 8C, 8D, and 8F).

FIGS. 9A and 9B are an example of a method for creating a first mask to re-label kerogen as pore in locations where signal is being read from inside the pore. FIG. 9A corresponds to FIG. 7D, and FIG. 9B shows an example of the created mask. The ESB shown in FIG. 9A is analyzed so that all of the pixels which have gray scale values and only the gray scale values above those which represent real kerogen in the SE2 image are selected, which are indicated as "sea" areas in FIG. 9B. Locations where the signal is being acquired from inside the pore have higher gray scale values than in locations where real kerogen is present so it is possible to re-label these areas as pore without re-labeling those areas which are real kerogen. For example, only pixels which have gray scale value exceeding a preselected gray scale threshold value for real kerogen are selected in defining a first mask.

FIGS. 10A-10B include FIG. 10A which corresponds to FIG. 7D, and FIG. 10B shows an example of a second mask created to re-label mineral as kerogen in locations where the kerogen has charged into gray scale values different than real kerogen in response to the FIB-SEM scanning procedure. The order of creation of the indicated first and second masks is not limited. The ESB data in FIG. 10A is analyzed so that all the gray scale values and only the gray scale values below those which represent real mineral in the SE2 image are selected, which is indicated by the shading added in FIG. 10B. For example, analysis of the ESB two-dimensional images of the plurality of dual sets of image data can be done by selecting only pixels which have gray scale values below a preselected gray scale threshold value for mineral to define the second mask. Since charging is not as much of an issue in the ESB data set as compared to the SE2 data set, it is possible to select charged areas of the kerogen in the ESB data set that cannot be segmented as kerogen in the SE2 data set. However, as the boundaries of the ESB data sets may be somewhat fuzzy and the resolution lower, the kerogen phase from the ESB data set can be used but may not be the optimal solution. For example, the boundaries can be segmented from the SE2 data set, such as using the indicated data visualization and analysis software, while the ESB data can be used only to fill in the charged areas inside these boundaries.

FIGS. 11A-11I includes three sets of images which show the effect of the two masks created from the ESB image on the resultant segmentation. The SE2 data set in FIGS. 11A-11C corresponds to that of FIGS. 8A-8C, and those in FIGS. 11D-11F correspond to FIGS. 8D-8F. The base segmentation modified by the two masks is shown in FIGS. 11G-11I. The angle and horizontal arrows indicate the same regions as discussed before in FIGS. 8A-8F. In FIG. 11H, kerogen inside the pore space near the angled arrow has been properly re-labeled as pore and, in FIG. 11I, the mineral near the horizontal arrow has been properly re-labeled as kerogen. The base analyzed two-dimensional image based on the SE2 image data is thus altered and corrected by the first mask and the second mask. Pixels are reallocated from kerogen to pore space in the base analyzed two-dimensional image based on the SE2 data using the first mask and pixels are reallocated from mineral to kerogen in the base analyzed two-dimensional images based on the SE2 data using the second mask.

Figure 12A:
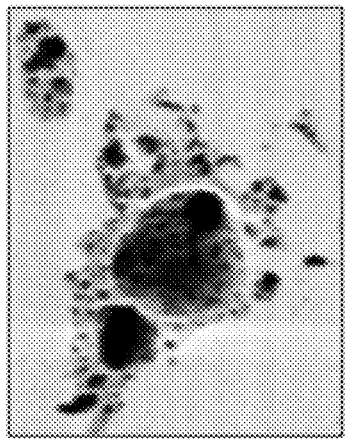
FIGS. 12A-12C are three magnified views of the pore space near the arrow shown in FIGS. 11B, 11E, and 11H, respectively, wherein the SE2 data set is shown in FIG. 12A, the base segmentation in FIG. 12B, and the base segmentation after correction by the two masks in FIG. 12C, according to an example of the present invention.
Figure 12B:
Figure 12C:
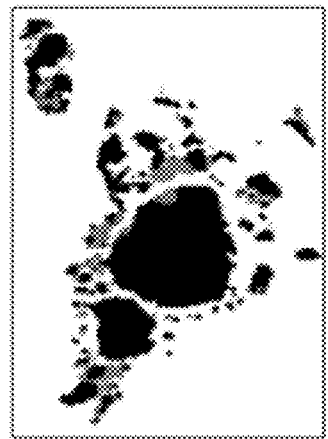

FIGS. 12A-12C are three magnified views of the pore space near the arrow shown in FIGS. 11B, 11E, and 11H, respectively, wherein the SE2 data set is shown in FIG. 12A, the base segmentation in FIG. 12B, the base segmentation corrected by the two masks in FIG. 12C.

Table 1, which is shown in FIG. 13, presents a comparison of results obtained between a comparison method wherein experienced analysts are used to manually analyze the images to segment FIB data sets and the indicated present method in terms of total porosity and kerogen volume fractions. Kerogen values increase or decrease based on the nature of the sample. As shown in the results, in some cases, the manual method seriously underestimates the total porosity of samples and at least to a degree in all cases.

Although for sake of simplifying this illustration, it only shows images captured and corrected for single slices of a sample, it will be appreciated that the indicated FIB-SEM workstation can be used to remove successive layers from the sample by an ion beam directed at the sample to provide a different exposed surface on the sample, and the different exposed slice can be scanned and dual sets of image data can be captured for each slice for alignment, analysis and correction as shown herein. A 3D volume can be created with the resulting stack of corrected images. A system of the present application can include at least one device to display, print, or store results of the scans, processed images, corrected images, or other results. For example, the resulting 3D volume can be displayed (e.g., on a LED display, LCD display, CRT display, HD display, plasma screen, or other displays), stored in memory, printed with a printer (e.g., slice-wise), or any combinations of these.

The indicated analyses and corrections made to the image data sets provided in the present methods can be performed in a highly automated manner. A program module or modules can be programmed into data visualization and analysis software, for example, for executing this operation. A program product can be stored on a non-transitory computer-readable medium, which when executed, enables a computer infrastructure to perform at least the indicated stacking, alignment, analysis, and image correction steps. The computer-readable medium can comprise program code embodied on one or more portable storage articles of manufacture (e.g., memory stick, flash memory, DVD, compact disc, magnetic disk, a tape, etc.), on one or more data storage portions of a computing device, such as memory and/or other storage system, and/or as a data signal traveling over a LAN or internet network (e.g., during a wired/wireless electronic distribution of the program product). To this extent, the deployment of the program product can comprise one or more of (1) installing program code on a computing device, such as computer, from a computer-readable medium; (2) adding one or more computing devices to the computer infrastructure; and (3) incorporating and/or modifying one or more existing systems of the computer infrastructure to enable the computer infrastructure to perform the processes of the invention. Program code can be embodied as one or more types of program products, for example, such as an application/software program, component software/a library of, functions, an operating system, a basic I/O system/driver for a particular computing and/or I/O device, and the like.

The technical benefit of the present method can be more accurate segmentations and therefore more accuracy in all resulting 2D and 3D image products. Segmentations themselves can be repeatable and can be more consistent among multiple users. Segmentations are less likely to miss porosity and kerogen in rock samples, for example, and can be more repeatable because of the reduced or avoided need for manual labeling of materials. The resulting quality of computed properties can be enhanced. The segmentation process can be shorter than manual methods and therefore more efficient. An economic benefit of the present method can be higher quality, more consistent results in a shorter period of time. More samples can be completed using the same human resources. More projects can be completed for a given time using the same human resources as the present method can reduce time needed to segment FIB data sets while reducing the need to manual label phases of a sample image.

The present invention also includes the following aspects/embodiments/features in any order and/or in any combination:

1. The present invention relates to a method for generating a multi-dimensional image of a sample, comprising:

capturing a first two-dimensional substrate image of a surface region of the sample with a first image capturing modality, wherein locations of at least one material at the surface region are captured;

capturing a second two-dimensional substrate image of the surface region with a second image capturing modality which is different from the first image capturing modality, wherein the second image capturing modality provides greater accuracy with respect to locations of at least one material at the surface region than the first image capturing modality;

spatially aligning the first two-dimensional substrate image based on the second two-dimensional substrate image;

generating a first corrected two-dimensional substrate image based at least in part on the locations of the at least one material in the second two-dimensional substrate image.

2. The method of any preceding or following embodiment/feature/aspect, wherein the first corrected two-dimensional substrate image comprises a first material content determined by the second modality having higher accuracy with respect to identifying that first material than when measured with the first modality, and a porosity content of the sample is determined by the first modality having higher accuracy with respect to identifying porosity in the first two-dimensional image than the second modality.

3. The method of any preceding or following embodiment/feature/aspect, wherein the generating comprises:

identifying locations of the at least one material in the first two-dimensional substrate image which correspond with the locations of the at least one material in the second two-dimensional substrate image; and correcting the locations of the at least one material in the first two-dimensional substrate image which correspond to the locations of the at least one material in the second two-dimensional substrate image to generate the first corrected two-dimensional substrate image.

4. The method of any preceding or following embodiment/feature/aspect, further comprising:

a) removing a layer of the sample at the surface region after the capturing of the first and second two-dimensional substrate images to expose a different surface region of the sample;

b) capturing a first two-dimensional substrate image at the different surface region with the first image capturing modality;

c) capturing a second two-dimensional substrate image at the different surface region with the second image capturing modality;

d) repeating steps a), b), and c) for a plurality of times;

e) spatially aligning the first two-dimensional substrate images based on the second two-dimensional substrate images;

f) identifying, for each different surface region, the locations of the at least one material in the first two-dimensional substrate image which correspond with the locations of the at least one material in the second two-dimensional substrate image;

g) correcting, for each of the different surface regions, the locations of the at least one material in the first two-dimensional substrate image which correspond to the locations of the at least one material in the second two-dimensional substrate image to generate a second corrected two-dimensional substrate image;

h) generating a three-dimensional substrate volume with the corrected two-dimensional substrate images.

5. The method of any preceding or following embodiment/feature/aspect, wherein the generating comprises determining a porosity of the substrate based on the surface electron two-dimensional substrate image corrected by comparison to the backscatter electron substrate image.

6. The method of any preceding or following embodiment/feature/aspect, wherein the first image capturing modality comprises scanning said surface region of the sample by a charged particle beam and recording first image data by detecting secondary (surface) electrons emitted by the sample and storing the first image data as a first set of image data which corresponds to the first two-dimensional substrate image, and wherein the second image capturing modality comprises:

i) scanning the surface region of the sample by the charged particle beam and recording second image data by detecting backscattered electrons emitted by the sample and storing the second image data as a second set of image data which corresponds to the second two-dimensional substrate image, or ii) scanning the surface region of the sample by the charged particle beam and recording second image data by detecting x-rays emitted by the sample with an energy dispersive spectrometer and storing the second image data as a second set of image data.

7. A method of creating a three-dimensional volume, comprising:

capturing a plurality of surface electron two-dimensional substrate images;

capturing a plurality of backscatter electron two-dimensional substrate images;

determining an alignment of the plurality of backscatter electron substrate images for generating a three-dimensional volume;

generating a three-dimensional substrate volume from the surface electron two-dimensional substrate images using the alignment of the plurality of backscatter electron substrate images.

8. The method of any preceding or following embodiment/feature/aspect, wherein the capturing steps employ an electron microscope comprising a surface electron detector and a backscatter electron detector.

9. The method of any preceding or following embodiment/feature/aspect, wherein the electron microscope is a scanning electron microscope (SEM) capable of scanning a substrate with a primary charged particle beam wherein the substrate emits separately detectable surface electrons and backscattered electrons.

10. The method, of any preceding or following embodiment/feature/aspect, wherein the further comprising:

removing a layer of the substrate after a first surface electron two-dimensional substrate image and a first backscatter electron two-dimensional substrate image is captured, and before a second surface electron two-dimensional substrate image and a second backscatter electron two-dimensional substrate image is captured.

11. The method of any preceding or following embodiment/feature/aspect, wherein the step of removing a layer is repeated after the second surface electron two-dimensional substrate image and the second backscatter electron two-dimensional substrate image is captured, and repeating the step of removing after each subsequent set of surface electron and backscatter electron image captures until at least after the penultimate set of image captures.

12. The method of any preceding or following embodiment/feature/aspect, wherein the removing comprises dry etching, sputtering, or any combinations thereof, by a focused ion beam.

13. The method of any preceding or following embodiment/feature/aspect, further comprising:
determining a porosity of the substrate based on a series of the surface electron two-dimensional substrate images corrected by comparison to the plurality of backscatter electron substrate images.

14. The method of any preceding or following embodiment/feature/aspect, wherein the substrate comprises at least one rock or mineral.

15. The method of any preceding or following embodiment/feature/aspect, wherein the substrate is shale, mudstone, siltstone, claystone, porcelanite, dolomite, or a combination thereof.

16. The method of any preceding or following embodiment/feature/aspect, wherein the substrate comprises shale.

17. The method of any preceding or following embodiment/feature/aspect, further comprising:
determining organic-based inclusion content of the substrate from the backscatter electron substrate three-dimensional image.

18. The method of any preceding or following embodiment/feature/aspect, wherein the organic-based inclusion comprises kerogen.

19. The method of any preceding or following embodiment/feature/aspect, the method further comprising:
at least one of displaying the surface electron substrate three-dimensional image and the backscatter electron substrate three-dimensional image on a screen, printing the surface electron substrate three-dimensional image and the backscatter electron substrate three-dimensional image, and storing the surface electron substrate three-dimensional image and the backscatter electron substrate three-dimensional image in a memory device.

20. The method of any preceding or following embodiment/feature/aspect, wherein the volume generated is from voxels having side lengths of from about 1 nm to about 30 nm.

21. The method of any preceding or following embodiment/feature/aspect, wherein the layer removed has a thickness from about 1 nm to about 30 nm.

22. A method of creating a three-dimensional volume, comprising:
capturing a plurality of surface electron two-dimensional substrate images;
capturing a plurality of backscatter electron two-dimensional substrate images;
determining an alignment of the plurality of backscatter electron substrate images for generating a three-dimensional volume;
generating a three-dimensional substrate volume from the backscatter electron two-dimensional substrate data using the alignment of the plurality of surface electron substrate images.

23. A method for generating a three-dimensional digital image of a sample, comprising the steps of:

a) scanning a surface of a sample by a primary electron beam generated by an electron source, wherein the sample comprises kerogen and mineral, and (i) recording first image data based on detecting surface electrons of the sample and storing the first image data as a first two-dimensional image comprising a value of gray scale allocated to each of a plurality of pixels in the image, and (ii) recording second image data based on detecting backscattered electrons emitted by the sample during the scanning and storing the second image data as a second two-dimensional image comprising a value of gray scale allocated to each of a plurality of pixels in the image, wherein the first and second two-dimensional images provide a dual set of image data associated with the scanned surface;

b) removing a layer from the sample by an ion beam directed at the sample to provide a different exposed surface on the sample;

c) scanning the different exposed surface of the sample by the primary electron beam, and repeating steps a)(i) and a)(ii), to provide a dual set of image data associated with the different exposed surface;

d) repeating the step b) and the step c) for a plurality of times;

e) stacking a plurality of the dual sets of image data obtained from steps a) and d) by positioning the respective first and second two-dimensional images in a same sequential order as obtained from the sample;

f) aligning the first two-dimensional images by reference to the second two-dimensional images;

g) analyzing the first and second two-dimensional images of the plurality of dual sets of image data comprising allocating the pixels to pore space or kerogen to form analyzed first and second two-dimensional images;

h) identifying pixels allocated to kerogen in the analyzed first two-dimensional images which are not allocated to kerogen in the analyzed second two-dimensional images in the dual set of image data; and i) reallocating the pixels identified in step h) to pore space in the analyzed first two-dimensional images associated with the dual set of image data.

24. A method for generating a three-dimensional digital image of a sample, comprising the steps of:

a) scanning a surface of a sample by a primary electron beam generated by an electron source, wherein the sample comprises kerogen and mineral, and (i) recording first image data based on detecting surface electrons of the sample and storing the first image data as a first two-dimensional image comprising a value of gray scale allocated to each of a plurality of pixels in the image, and (ii) recording second image data based on detecting backscattered electrons emitted by the sample during the scanning and storing the second image data as a second two-dimensional image comprising a value of gray scale allocated to each of a plurality of pixels in the image, wherein the first and second two-dimensional images provide a dual set of image data associated with the scanned surface;

b) removing a layer from the sample by an ion beam directed at the sample to provide a different exposed surface on the sample;

c) scanning the different exposed surface of the sample by the primary electron beam, and repeating steps a)(i) and a)(ii), to provide a dual set of image data associated with the different exposed surface;

d) repeating the step b) and the step c) for a plurality of times;

e) stacking a plurality of the dual sets of image data obtained from steps a) and d) by positioning the respective first and second two-dimensional images in a same sequential order as obtained from the sample;

f) aligning the first two-dimensional images by reference to the second two-dimensional images;

g) base analyzing the first two-dimensional images of the plurality of dual sets of image data comprising segmenting the pixels to pore space, kerogen, or mineral to form base analyzed first two-dimensional images;

h) first analyzing the second two-dimensional images of the plurality of dual sets of image data comprising selecting only pixels which have gray scale values exceeding a preselected gray scale threshold value for kerogen to define a first mask;

i) second analyzing the second two-dimensional images of the plurality of dual sets of image data comprising selecting only pixels which have gray scale values below a preselected gray scale threshold value for mineral to define a second mask;

j) altering the base analyzed first two-dimensional images by the first mask and the second mask, comprising reallocating pixels from kerogen to pore space in the base analyzed first two-dimensional images using the first mask and reallocating pixels from mineral to kerogen in the base analyzed first two-dimensional images using the second mask.

25. The method of any preceding or following embodiment/feature/aspect, wherein the removing of the layer in step b) comprises ion milling across the sample in a direction approximately perpendicular to a previous exposed surface of the sample to remove a layer of approximately uniform thickness of from about 1 nm to about 5 nm.

26. The method of any preceding or following embodiment/feature/aspect, wherein the sample comprises at least one rock or mineral.

27. The method of any preceding or following embodiment/feature/aspect, wherein the sample is shale, mudstone, siltstone, claystone, porcelanite, dolomite, or a combination thereof.

28. The method of any preceding or following embodiment/feature/aspect, further comprising step k), computing total pore space percentage and total kerogen percentage for reconciled images of the sample produced by step j).

29. A system for generating three-dimensional digital images of a sample, comprising:

a) a charged particle microscope comprising— a scanning electron beam column comprising an electron source for generating a primary electron beam, an ion beam column for generating a focused ion beam across a sample to successively remove a thin layer thereof in the direction of thickness of the sample and expose a different surface of the sample for scanning by the primary electron beam, a first charged particle detector for detecting surface electrons of the sample when scanned with the primary electron beam, a second charged particle detector for detecting backscattered electrons emitted by the scanned sample, b) a first signal processing system for recording first image data based on surface electrons of the sample detected by the first charged particle detector and storing the first image data as a first two-dimensional image comprising a value of gray scale allocated to each of a plurality of pixels in the image, and a second signal processing system for recording second image data based on backscattered electrons emitted by the sample during the scanning which are detected by the second charged particle detector and storing the second image data as a second two-dimensional image comprising a value of gray scale allocated to each of a plurality of pixels in the image, wherein the first and second two-dimensional images provide a dual set of image data associated with the different exposed surface;

c) a computer comprising at least one processor operable for executing a computer program capable of performing computations for creating a three dimensional digital representation of the sample, wherein the computations comprise: stacking a plurality of the dual sets of image data acquired by the first and second processing systems by positioning the respective first and second two-dimensional images in sequential order as obtained from the sample in alignment, base analyzing the first two-dimensional images of the plurality of dual sets of image data comprising allocating the pixels to pore space, kerogen, or mineral to form base analyzed first two-dimensional images, first analyzing the second two-dimensional images of the plurality of dual sets of image data comprising selecting only pixels which have gray scale values exceeding a preselected gray scale threshold value for kerogen to define a first mask, second analyzing the second two-dimensional images of the plurality of dual sets of image data comprising selecting only pixels which have gray scale values below a preselected gray scale threshold value for mineral to define a second mask, and altering the base analyzed first two-dimensional images by the first mask and the second mask, comprising reallocating pixels from kerogen to pore space in the base analyzed first two-dimensional images using the first mask and reallocating pixels from mineral to kerogen in the base analyzed first two-dimensional images using the second mask.

The present invention can include any combination of these various features or embodiments above and/or below as set forth in sentences and/or paragraphs. Any combination of disclosed features herein is considered part of the present invention and no limitation is intended with respect to combinable features.

Applicants specifically incorporate the entire contents of all cited references in this disclosure. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

It will be apparent to those skilled in the art that various modifications and variations can be made to the embodiments of the present invention without departing from the spirit or scope of the present invention. Thus, it is intended that the present invention covers other modifications and variations of this invention provided they come within the scope of the appended claims and their equivalents.

What is claimed is:

1. A method for generating a multi-dimensional image of a sample, comprising:

capturing a first two-dimensional substrate image of a surface region of the sample with a first image capturing modality, wherein the first two-dimensional substrate image is a surface electron two-dimensional substrate image and wherein locations of at least one material at the surface region are captured;

capturing a second two-dimensional substrate image of the surface region with a second image capturing modality which is different from the first image capturing modality, wherein the second image capturing modality provides greater accuracy with respect to locations of at least one material at the surface region than the first image capturing modality;

spatially aligning the first two-dimensional substrate image based on the second two-dimensional substrate image;

generating a first corrected two-dimensional substrate image based at least in part on the locations of the at least one material in the second two-dimensional substrate image, wherein said generating comprises determining a porosity of the substrate based on the surface electron two-dimensional substrate image corrected by comparison to the second two-dimensional substrate image.

2. The method of claim 1, wherein the first corrected two-dimensional substrate image comprises a first material content determined by the second modality having higher accuracy with respect to identifying that first material than when measured with the first modality, and a porosity content of the sample is determined by the first modality having higher accuracy with respect to identifying porosity in the first two-dimensional image than the second modality.

3. The method of claim 1, wherein said generating comprises:
identifying locations of the at least one material in the first two-dimensional substrate image which correspond with the locations of the at least one material in the second two-dimensional substrate image; and
correcting the locations of the at least one material in the first two-dimensional substrate image which correspond to the locations of the at least one material in the second two-dimensional substrate image to generate the first corrected two-dimensional substrate image.

4. The method of claim 3, further comprising:
a) removing a layer of the sample at the surface region after the capturing of the first and second two-dimensional substrate images to expose a different surface region of the sample;
b) capturing a first two-dimensional substrate image at the different surface region with the first image capturing modality;
c) capturing a second two-dimensional substrate image at the different surface region with the second image capturing modality;
d) repeating steps a), b), and c) for a plurality of times;
e) spatially aligning the first two-dimensional substrate images based on the second two-dimensional substrate images;
f) identifying, for each different surface region, the locations of the at least one material in the first two-dimensional substrate image which correspond with the locations of the at least one material in the second two-dimensional substrate image;
g) correcting, for each of the different surface regions, the locations of the at least one material in the first two-dimensional substrate image which correspond to the locations of the at least one material in the second two-dimensional substrate image to generate a second corrected two-dimensional substrate image;
h) generating a three-dimensional substrate volume with the corrected two-dimensional substrate images.

5. The method of claim 1, wherein the first image capturing modality comprises scanning said surface region of the sample by a charged particle beam and recording first image data by detecting secondary (surface) electrons emitted by said sample and storing said first image data as a first set of image data which corresponds to the first two-dimensional substrate image, and
wherein the second image capturing modality comprises:
i) scanning said surface region of the sample by the charged particle beam and recording second image data by detecting backscattered electrons emitted by said sample and storing said second image data as a second set of image data which corresponds to the second two-dimensional substrate image, or
ii) scanning said surface region of the sample by the charged particle beam and recording second image data by detecting x-rays emitted by said sample with an energy dispersive spectrometer and storing said second image data as a second set of image data.

6. A method of creating a three-dimensional volume, comprising:
capturing a plurality of surface electron two-dimensional substrate images;
capturing a plurality of backscatter electron two-dimensional substrate images;
removing a layer of the substrate after a first surface electron two-dimensional substrate image and a first backscatter electron two-dimensional substrate image is captured, and before a second surface electron two-dimensional substrate image and a second backscatter electron two-dimensional substrate image is captured, wherein the step of removing a layer is repeated after the second surface electron two-dimensional substrate image and the second backscatter electron two-dimensional substrate image is captured, and repeating the step of removing after each subsequent set of surface electron and backscatter electron image captures until at least after the penultimate set of image captures;
determining an alignment of the plurality of backscatter electron substrate images for generating a three-dimensional volume;
generating a three-dimensional substrate volume from the surface electron two-dimensional substrate images using the alignment of the plurality of backscatter electron substrate images;
determining a porosity of the substrate based on a series of the surface electron two-dimensional substrate images corrected by comparison to the plurality of backscatter electron substrate images.

7. The method of claim 6, wherein the capturing steps employ an electron microscope comprising a surface electron detector and a backscatter electron detector.

8. The method of claim 7, wherein the electron microscope is a scanning electron microscope (SEM) capable of scanning a substrate with a primary charged particle beam wherein the substrate emits separately detectible surface electrons and backscattered electrons.

9. The method of claim 4, wherein the removing comprises dry etching, sputtering, or any combinations thereof, by a focused ion beam.

10. The method of claim 6, wherein the substrate comprises at least one rock or mineral.

11. The method of claim 6, wherein the substrate is shale, mudstone, siltstone, claystone, porcelanite, dolomite, or a combination thereof.

12. The method of claim 6, wherein the substrate comprises shale.

13. The method of claim 6, further comprising:
   determining organic-based inclusion content of the substrate from the backscatter electron substrate three-dimensional image.

14. The method of claim 13, wherein the organic-based inclusion comprises kerogen.

15. The method of claim 6, further comprising:
   at least one of displaying the surface electron substrate three-dimensional image and the backscatter electron substrate three-dimensional image on a screen, printing the surface electron substrate three-dimensional image and the backscatter electron substrate three-dimensional image, and storing the surface electron substrate three-dimensional image and the backscatter electron substrate three-dimensional image in a memory device.

16. The method of claim 6, wherein the volume generated is from voxels having side lengths of from about 1 nm to about 30 nm.

17. The method of claim 16, wherein the layer removed has a thickness from about 1 nm to about 30 nm.

18. A method for generating a three-dimensional digital image of a sample, comprising steps of:
   a) scanning a surface of a sample by a primary electron beam generated by an electron source, wherein the sample comprises kerogen and mineral, and (i) recording first image data based on detecting surface electrons of the sample and storing the first image data as a first two-dimensional image comprising a value of gray scale allocated to each of a plurality of pixels in the image, and (ii) recording second image data based on detecting backscattered electrons emitted by said sample during said scanning and storing the second image data as a second two-dimensional image comprising a value of gray scale allocated to each of a plurality of pixels in the image, wherein the first and second two-dimensional images provide a dual set of image data associated with said scanned surface;
   b) removing a layer from the sample by an ion beam directed at said sample to provide a different exposed surface on the sample;
   c) scanning said different exposed surface of said sample by the primary electron beam, and repeating steps a)(i) and a)(ii), to provide a dual set of image data associated with said different exposed surface;
   d) repeating said step b) and said step c) for a plurality of times;
   e) stacking a plurality of the dual sets of image data obtained from steps a) and d) by positioning the respective first and second two-dimensional images in a same sequential order as obtained from the sample;
   f) aligning the first two-dimensional images by reference to said second two-dimensional images;
   g) analyzing said first and second two-dimensional images of said plurality of dual sets of image data comprising allocating said pixels to pore space or kerogen to form analyzed first and second two-dimensional images;
   h) identifying pixels allocated to kerogen in the analyzed first two-dimensional images which are not allocated to kerogen in the analyzed second two-dimensional images in said dual set of image data; and
   i) reallocating the pixels identified in step h) to pore space in the analyzed first two-dimensional images associated with said dual set of image data.

19. A method for generating a three-dimensional digital image of a sample, comprising steps of:
   a) scanning a surface of a sample by a primary electron beam generated by an electron source, wherein the sample comprises pores, kerogen and minerals, and (i) recording first image data based on detecting surface electrons of the sample and storing the first image data as a first two-dimensional image comprising a value of gray scale allocated to each of a plurality of pixels in the image, and (ii) recording second image data based on detecting backscattered electrons emitted by said sample during said scanning and storing the second image data as a second two-dimensional image comprising a value of gray scale allocated to each of a plurality of pixels in the image, wherein the first and second two-dimensional images provide a dual set of image data associated with said scanned surface;
   b) removing a layer from the sample by an ion beam directed at said sample to provide a different exposed surface on the sample;
   c) scanning said different exposed surface of said sample by the primary electron beam, and repeating steps a)(i) and a)(ii), to provide a dual set of image data associated with said different exposed surface;
   d) repeating said step b) and said step c) for a plurality of times;
   e) stacking a plurality of the dual sets of image data obtained from steps a) and d) by positioning the respective first and second two-dimensional images in a same sequential order as obtained from the sample;
   f) aligning the first two-dimensional images by reference to said second two-dimensional images;
   g) base analyzing said first two-dimensional images of said plurality of dual sets of image data comprising segmenting said pixels to pore space, kerogen, or mineral to form base analyzed first two-dimensional images;
   h) first analyzing said second two-dimensional images of said plurality of dual sets of image data comprising selecting only pixels which have gray scale values exceeding a preselected gray scale threshold value for kerogen to define a first mask;
   i) second analyzing said second two-dimensional images of said plurality of dual sets of image data comprising selecting only pixels which have gray scale values below a preselected gray scale threshold value for mineral to define a second mask;
   j) altering said base analyzed first two-dimensional images by the first mask and the second mask, comprising reallocating pixels from kerogen to pore space in the base analyzed first two-dimensional images using the first mask and reallocating pixels from mineral to kerogen in the base analyzed first two-dimensional images using the second mask.

20. The method of claim 19, wherein the removing of the layer in step b) comprises ion milling across said sample in a direction approximately perpendicular to a previous exposed surface of the sample to remove a layer of approximately uniform thickness of from about 1 nm to about 5 nm.

21. The method of claim 19, wherein the sample comprises at least one rock or mineral.

22. The method of claim 19, wherein the sample is shale, mudstone, siltstone, claystone, porcelanite, dolomite, or a combination thereof.

23. The method of claim 19, further comprising step k), computing total pore space percentage and total kerogen percentage for reconciled images of the sample produced by step j).

24. A system for generating three-dimensional digital images of a sample, comprising:
  a) a charged particle microscope comprising—
    a scanning electron beam column comprising an electron source for generating a primary electron beam,
    an ion beam column for generating a focused ion beam across a sample to successively remove a thin layer thereof in the direction of thickness of the sample and expose a different surface of the sample for scanning by the primary electron beam,
    a first charged particle detector for detecting surface electrons of the sample when scanned with the primary electron beam,
    a second charged particle detector for detecting backscattered electrons emitted by the scanned sample,
  b) a first signal processing system for recording first image data based on surface electrons of the sample detected by said first charged particle detector and storing the first image data as a first two-dimensional image comprising a value of gray scale allocated to each of a plurality of pixels in the image, and a second signal processing system for recording second image data based on backscattered electrons emitted by said sample during said scanning which are detected by said second charged particle detector and storing the second image data as a second two-dimensional image comprising a value of gray scale allocated to each of a plurality of pixels in the image, wherein the first and second two-dimensional images provide a dual set of image data associated with said different exposed surface;
  c) a computer comprising at least one processor operable for executing a computer program capable of performing computations for creating a three dimensional digital representation of the sample, wherein said computations comprise:
    stacking a plurality of the dual sets of image data acquired by the first and second processing systems by positioning the respective first and second two-dimensional images in sequential order as obtained from the sample in alignment,
    base analyzing said first two-dimensional images of said plurality of dual sets of image data comprising allocating said pixels to pore space, kerogen, or mineral to form base analyzed first two-dimensional images,
    first analyzing said second two-dimensional images of said plurality of dual sets of image data comprising selecting only pixels which have gray scale values exceeding a preselected gray scale threshold value for kerogen to define a first mask,
    second analyzing said second two-dimensional images of said plurality of dual sets of image data comprising selecting only pixels which have gray scale values below a preselected gray scale threshold value for mineral to define a second mask, and
    altering said base analyzed first two-dimensional images by the first mask and the second mask, comprising reallocating pixels from kerogen to pore space in the base analyzed first two-dimensional images using the first mask and reallocating pixels from mineral to kerogen in the base analyzed first two-dimensional images using the second mask.

* * * * *